United States Patent
Suzuki et al.

(10) Patent No.: US 6,717,877 B2
(45) Date of Patent: Apr. 6, 2004

(54) SEMICONDUCTOR INTEGRATION CIRCUIT DEVICE

(75) Inventors: Takeshi Suzuki, Tachikawa (JP);
Shigeru Nakahara, Musashimurayama (JP); Keiichi Higeta, Hamura (JP); Takeshi Kusunoki, Tachikawa (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 92 days.

(21) Appl. No.: 10/038,663

(22) Filed: Jan. 8, 2002

(65) Prior Publication Data
US 2002/0097623 A1 Jul. 25, 2002

(30) Foreign Application Priority Data
Jan. 19, 2001 (JP) ........................................ 2001-010960

(51) Int. Cl.$^7$ ................................................ G11C 7/00
(52) U.S. Cl. .................... 365/210; 365/185.2; 365/194; 365/233
(58) Field of Search ................................ 365/210, 194, 365/185.2, 233; 327/158, 163

(56) References Cited

U.S. PATENT DOCUMENTS

| | | | | |
|---|---|---|---|---|
| 5,841,719 A | * | 11/1998 | Hirata | 365/210 |
| 6,009,040 A | * | 12/1999 | Choi et al. | 365/233 |
| 6,225,843 B1 | * | 5/2001 | Taniguchi et al. | 327/158 |
| 6,229,363 B1 | * | 5/2001 | Eto et al. | 327/158 |
| 6,522,567 B2 | * | 2/2003 | Iwanari | 365/145 |

FOREIGN PATENT DOCUMENTS

JP 9-259589 10/1997

* cited by examiner

*Primary Examiner*—Son T. Dinh

(57) ABSTRACT

A semiconductor integrated circuit device includes a first variable delay circuit which delays a timing signal for activating a sense amplifier which is supplied with a signal read out from a memory array and amplifies the signal so that a timing difference between a dummy signal read out from a dummy memory cell and the timing signal of the sense amplifier is detected by a detection circuit to be made small in accordance with an output of the detection circuit, and a second variable delay circuit which adjusts a relative timing difference between the dummy signal and the timing signal of the sense amplifier.

15 Claims, 20 Drawing Sheets

FIG. 6
S0 : L
S1 : L
S2 : H
S3 : L
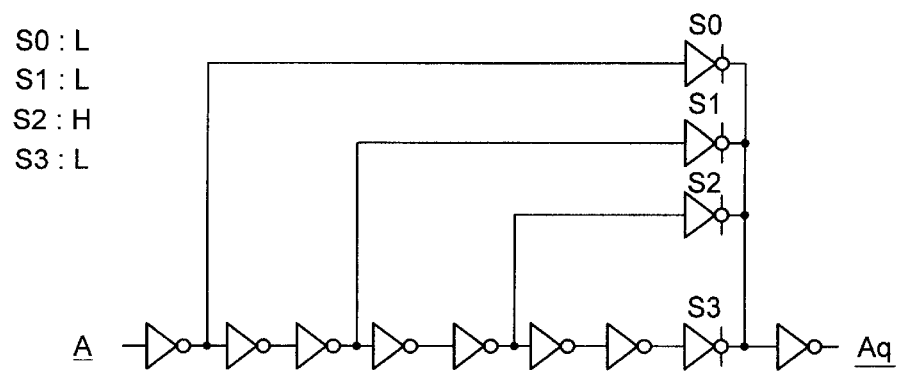
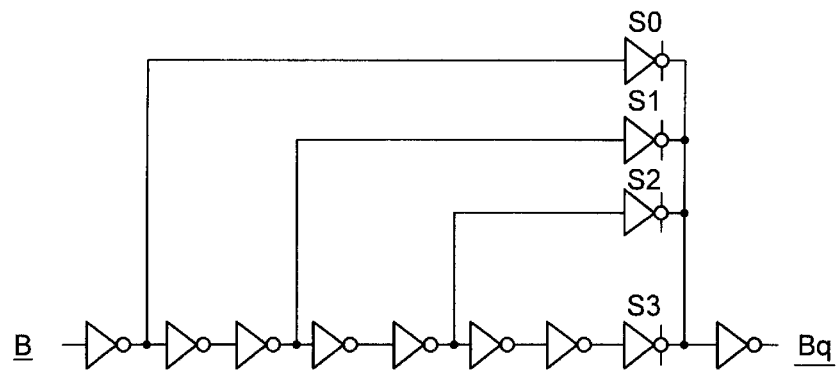

SEMICONDUCTOR INTEGRATION CIRCUIT DEVICE

BACKGROUND OF THE INVENTION

The present invention relates to a semiconductor integrated circuit device and more particularly to a technique effective to be utilized in a large scale integrated circuit including a memory circuit capable of performing high-speed reading operation.

JP-A-9-259589 discloses a technique for controlling a timing of an activation signal of a sense amplifier for amplifying data read out from a memory cell by means of a signal formed by using a signal on a dummy bit line.

SUMMARY OF THE INVENTION

Even when the signal on the dummy bit line is used to control the activation signal of the sense amplifier, it is necessary to set an input offset caused by scattering in a process of a pair element of the sense amplifier or a time margin corresponding to a worst case of scattering in a process in the timing control system. That is, in order to operate the sense amplifier exactly, it is necessary to set so that the activation time of the sense amplifier is delayed in accordance with the time margin required until a signal amount taking the offset into consideration is obtained or a time margin corresponding scattering in timing in a control circuit.

It is an object of the present invention to provide a semiconductor integrated circuit device including a memory circuit attaining high-speed operation corresponding to the capability of individual circuits. The above and other objects and novel features of the present invention will be apparent from the following description and the accompanying drawings of the specification.

Representatives of the inventions disclosed in the present application are summarized as follows: The timing signal for activating a sense amplifier which is supplied with a signal read out from a memory array and amplifies the signal can be delayed by a first variable delay circuit so that a timing difference of a dummy signal read out from a dummy memory cell and the timing signal of the sense amplifier can be detected by a detection circuit and be made small in accordance with an output of the detection circuit, and a relative timing difference of the dummy signal and the timing signal of the sense amplifier can be adjusted by a second variable delay circuit.

BRIEF DESCRIPTION OF THE DRAWINGS

FIG. 6 is a circuit diagram schematically illustrating an embodiment of a triggering variable delay circuit used in the memory circuit included in the semiconductor integrated circuit device according to the present invention;

DESCRIPTION OF THE EMBODIMENTS

Figure 1:
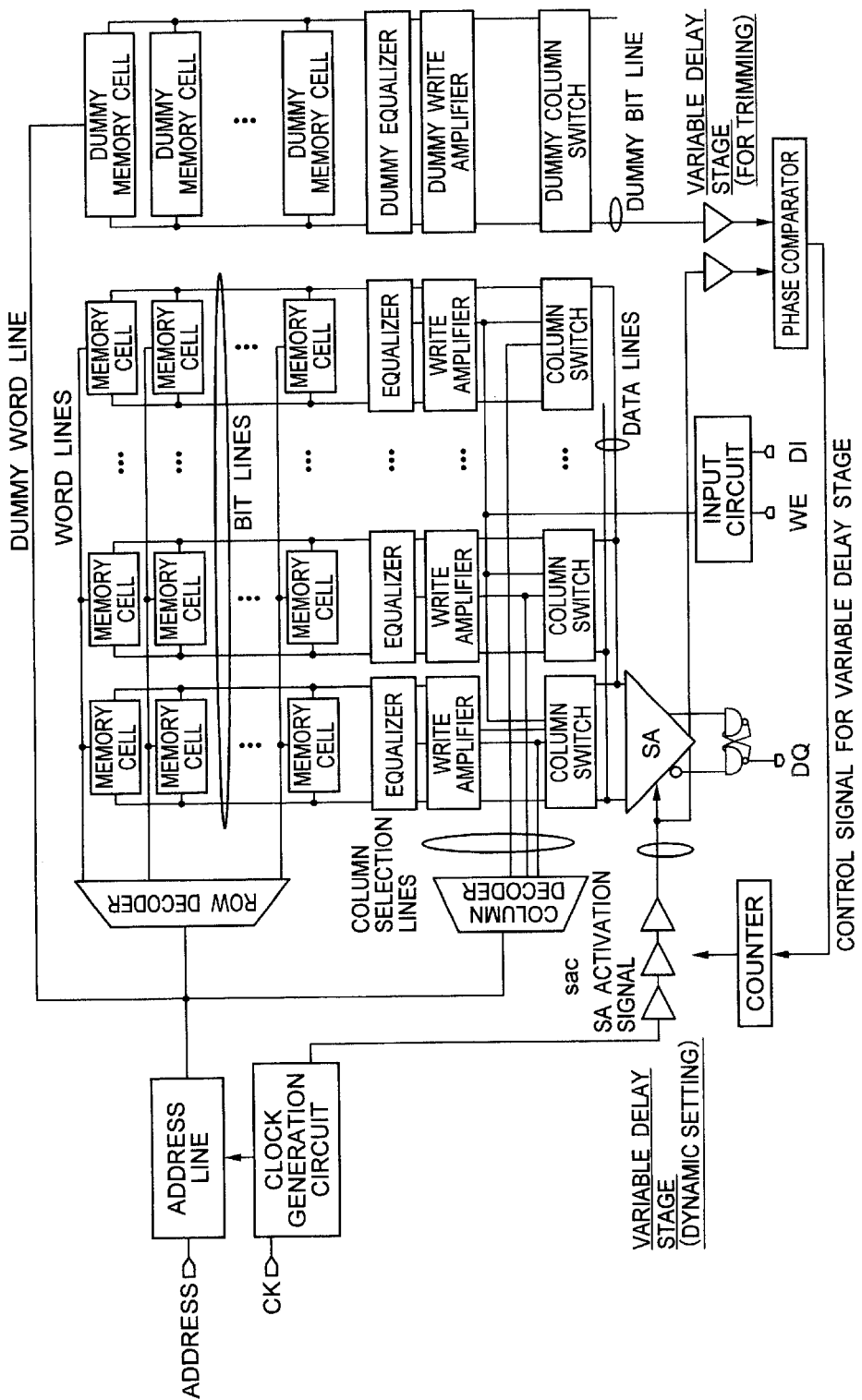
FIG. 1 is a block diagram schematically illustrating an embodiment of a memory circuit included in a semiconductor integrated circuit device according to the present invention.

FIG. 1 is a block diagram schematically illustrating an embodiment of a memory circuit included in a semiconductor integrated circuit device according to the present invention. The memory circuit of the embodiment constitutes a RAM macro-cell included in a large scale integrated circuit having the microcomputer function as described later.

An address signal is taken in an address latch and an X address signal is supplied to a row decoder while a Y address signal is supplied to a column decoder. A memory array portion is constituted by memory cells disposed at intersecting points of word lines and pairs of bit lines and arranged into a matrix. The memory cell is constituted by a static memory cell formed of a CMOS latch circuit, although it is not limited thereto.

In the embodiment, dummy memory cells and dummy bit lines are provided so as to form an activation timing signal of a sense amplifier. The dummy memory cells are selected by means of a dummy word line. In addition to the memory cells and the dummy memory cells, equalizers and a dummy equalizer for pre-charging the pairs of bit lines and the pair of dummy bit lines to the same potential, respectively, write amplifiers, a dummy write amplifier, column switches and a dummy column switch are connected to the pairs of bit lines and the pairs of dummy bit lines of the memory array portion, respectively.

A pair of bit lines selected by the column switch circuits among the plurality of pairs of bit lines of the memory array is connected to a pair of data lines. The pair of data lines is connected to a sense amplifier SA. Amplification operation of the sense amplifier SA is controlled by an SA activation signal sac. An output signal of the sense amplifier SA is outputted from an output terminal DQ through a latch circuit constituted by logical gate circuits.

An input circuit is supplied with a write signal WE and write data DI and supplies the write signal to the pair of bit lines through a write amplifier selected by a column data. Since the memory cells on the pair of bit lines supplied with the write signal are subjected to selection by the word lines so that one memory cell thereof is selected by the word line, the write signal is supplied to this memory cell.

Although not limited, the sense amplifier may use a CMOS latch circuit of which amplification operation is controlled by a timing signal in order to attain low power consumption. The CMOS latch circuit can amplify a signal with high sensitivity by means of positive feedback operation thereof to thereby produce a large amplitude signal such as a CMOS level and since the CMOS latch circuit does not conduct any DC current due to the increased signal amplitude, the low power consumption is attained. That is, as compared with a static sense amplifier using a differential circuit for conducting a bias current (DC current) steadily, a level conversion circuit for converting a small amplitude signal in a differential circuit into a large amplitude signal such as a CMOS level is not also required. Accordingly, the circuit can be simplified and a current to be consumed can be reduced greatly.

However, when the sense amplifier is activated in the state that an amount of input signal is insufficient, the sense amplifier performs wrong sensing operation and cannot be recovered due to the positive feedback loop thereof. Accordingly, it is important to control the activation timing thereof. Accordingly, in the embodiment, a dummy circuit is used to ensure an amount of input signal required for the sensing operation of the sense amplifier. In the dummy circuit, memory states of the dummy memory cells are determined in the circuit configuration thereof so that a fixed or predetermined signal is always produced on one bit line of the pair of dummy bit lines. Accordingly, a fixed signal is always produced on one dummy bit line by selection operation of the dummy word line. Selection operation of the memory cell can be monitored indirectly from a signal on the dummy bit line obtained by selection operation in the dummy circuit.

A phase comparator compares the phase of the activation signal of the sense amplifier with that of the signal on the dummy bit line to form a control signal for a variable delay stage so that both the phases coincide with each other by means of the control signal and controls a delay time of a variable delay circuit for delaying the SA activation signal. Although not limited particularly, the variable delay stage control signal of the phase comparator is constituted by a binary signal defined by lead or lag of the phase and the binary signal is up/down-counted by a counter circuit. A count output of the counter circuit becomes a so-called integrated signal, which is used to control the delay time of the variable delay circuit.

The aforementioned control system has a role for adjusting the activation signal of the so-called dynamic sense amplifier. That is, the control system monitors environmental variation such as voltage variation and temperature variation and controls the activation timing of the sense amplifier SA. Since scattering in a process of elements cannot be treated only by the control system, the variable delay stage is connected to an input portion of the phase comparator. The variable delay stage is useful as trimming and is mainly used to compensate an input offset of the sense amplifier or deviation or shift in timing corresponding to relative scattering in a process of the dummy bit lines and the bit lines.

Accordingly, one of the variable delay stages for the SA activation signal and the dummy bit lines is set to have a fixed delay and the other is set to have a variable delay by means of trimming. For example, the delay stage for delaying the SA activation signal and the variable delay stage provided in a corresponding manner to the dummy bit lines are constituted by the same variable delay circuits. A fixed signal is supplied to the variable delay stage for delaying the SA activation signal so that its delay time becomes an intermediate delay time of the minimum delay time and the maximum delay time thereof, while the variable delay control signal formed by trimming set by a fuse or the like is supplied to the variable delay stage provided in a corresponding manner to the dummy bit lines. Thus, the adjustment range of the signal on the dummy bit lines to the activation signal of the sense amplifier can be increased.

In the embodiment, the variable delay stage for trimming provided in the input portion of the phase comparator is set from the outside of the memory circuit and a convergence point is set to an operation limit of the sense amplifier. Variation in environment is corrected by the phase comparator and the variable delay circuit controlled by the phase comparator, so that the sense amplifier can be used at its operation limit in accordance with scattering in a process of the individual circuits to thereby delete a timing margin and improve the access time to the RAM macro-cell.

Figure 2:
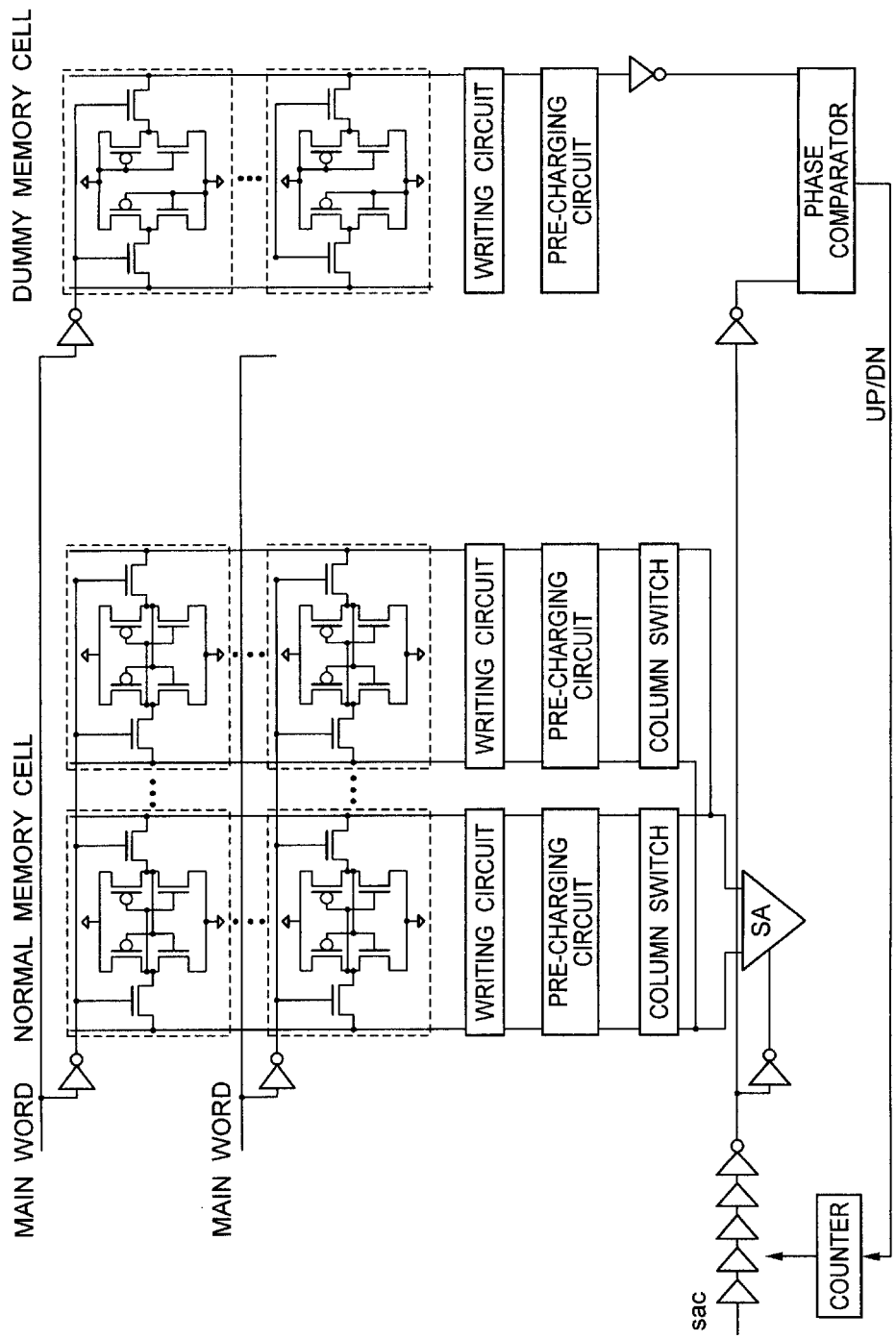
FIG. 2 is a block diagram schematically illustrating another embodiment of a memory circuit included in a semiconductor integrated circuit device according to the present invention.

Referring now to FIG. 2, another embodiment of a memory circuit included in a semiconductor integrated circuit device according to the present invention is illustrated in a block diagram. In the embodiment, the variable delay stage for trimming is set in accordance with the number of memory cells connected to the dummy bit lines. More particularly, when the number of memory cells connected to the dummy bit lines is equal to that connected to the normal bit lines, a signal amount-on the bit lines of a normal circuit and a signal amount on the dummy bit lines are varied substantially concurrently if scattering in a process is not taken into consideration. Accordingly, if the number of dummy memory cells connected to the dummy bit lines is increased by selection operation of the word line, driving power of the dummy bit lines can be increased to thereby adjust so that the signal amount thereof is changed swiftly.

For this purpose, inverter circuits connected to input portions of the phase comparator function to cause the delay time to have a difference (offset) in addition to the role of shaping of waveform and the number of dummy memory cells connected to the dummy bit lines can be increased to thereby adjust the timing of two signals at the input portions of the phase comparator in the same manner as the aforementioned embodiment. Although not limited particularly, in order to set the number of dummy memory cells connected to the dummy bit lines, the selection signal on the dummy word line may turn on an address selection MOSFET of the dummy memory cell by means of a clocked inverter circuit or the like which can be made effective to be operated by a switch control signal formed by trimming.

Figure 3:
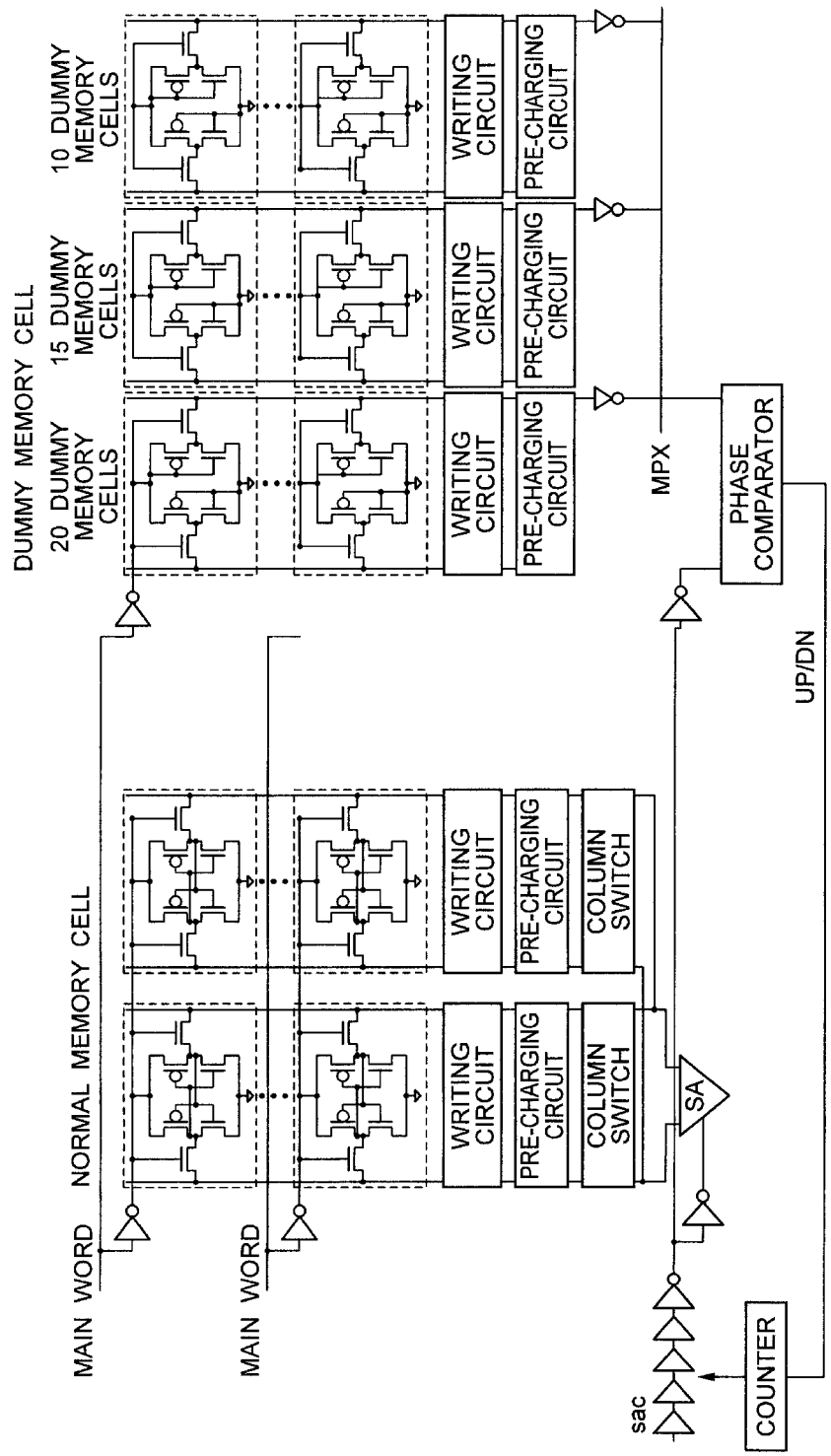
FIG. 3 is a block diagram schematically illustrating a further embodiment of a memory circuit included in a semiconductor integrated circuit device according to the present invention.

FIG. 3 is a block diagram schematically illustrating another embodiment of a memory circuit included in a semiconductor integrated circuit according to the present invention. Even in the embodiment, the variable delay stage for trimming is set in accordance with the number of memory cells connected to the dummy bit lines. In the embodiment, a plurality of pairs of dummy bit lines are provided and the respective numbers of dummy bit cells connected to the respective pairs of dummy bit lines are different such that the numbers are 20, 15, 10 and so on. Signals on the plurality of pairs of dummy bit lines are supplied through a multiplexer MPX to the phase comparator. The multiplexer MPX is controlled by control signal formed by trimming.

In the embodiment, the number of memory cells connected to the dummy bit lines is made equal to that connected to the normal bit lines and the number of dummy memory cells connected in response to selection operation of the dummy word line is made different such that it is 20, 15, 10 or the like. In addition, the number of memory cells for determining a load capacitance of the dummy bit lines can be also made different. That is, when the number of memory cells connected to the dummy bit lines is increased, the load of the dummy bit lines becomes heavy correspondingly, so that reading operation of a signal slows. Conversely, when the number of memory cells connected to the dummy bit lines is reduced, the load of the dummy bit lines lightens correspondingly, so that reading operation of a signal becomes fast.

Figure 4:
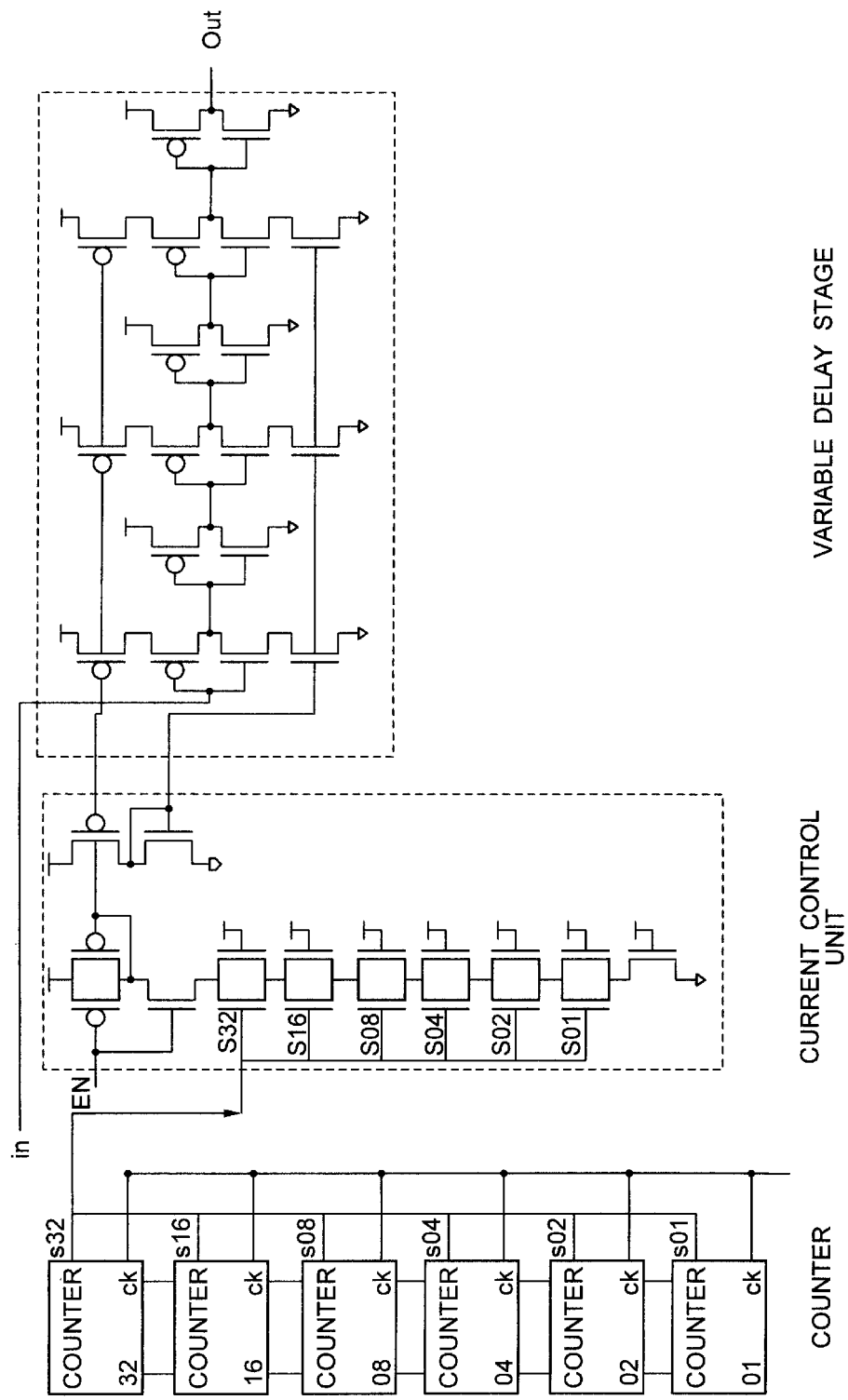
FIG. 4 is a circuit diagram schematically illustrating an embodiment of a dynamic control system of a sense amplifier used in the memory circuit included in the semiconductor integrated circuit device according to the present invention.

FIG. 4 is a circuit diagram schematically illustrating an embodiment of a dynamic control system of a sense amplifier used in a memory circuit included in a semiconductor integrated circuit device according to the present invention. In the embodiment, the counter, a current control unit, and the variable delay stage are illustrated by example as representative. The counter is constituted by binary up/down counters and although not limited particularly, 6-bit counters capable of counting 01 to 32 are used therefor. Count outputs s01, s02, s04, s08, s16 and s32 of the counters are connected in series to MOSFETs having on-resistance values of binary weights corresponding to the count outputs s01, s02, s04, s08, s16 and s32. An MOSFET having sufficiently large on-resistance is connected in parallel to the MOSFETs having the binary weights. Thus, the MOSFETs which are turned on by the count outputs s01, s02, s04, s08, s16 and s32 of the counters have the weights of resistances corresponding to the count outputs and accordingly the resistance values are added to obtain a series-combined resistance.

When all of the MOSFETs corresponding to s01, s02, s04, s08, s16 and s32 are off, a minimum current value is determined by the large resistance connected in parallel. The current is reduced in inverse proportion to the resistance value formed by the above series-connected MOSFETs so that 64 kinds of control currents can be formed in total. P-channel and N-channel MOSFETs controlled by a signal EN constitute a switch circuit for conducting a current in such a series-connected circuit steadily. That is, when the signal EN is high, a current signal corresponding to a digital input signal by the series-connected circuit is formed and the current is used to control an operation current of the variable delay stage through the P-channel MOSFET forming a diode. When the signal EN is low, the N-channel MOSFET is turned off so that the diode-connected P-channel MOSFET for producing the control current is turned off.

The 64 kinds of current signals formed as above set an operation current of a plurality of cascade-connected CMOS inverter circuits supplied with an input signal in and accordingly delay signals controlled to 64 kinds in a corresponding manner thereto can be obtained from an output terminal Out. Further, the circuit for converting the digital signal into the current signal may be formed by a MOSFET connected in parallel. That is, MOSFETs having weights of currents corresponding to s01, s02, s04, s08, s16 and s32 may be connected in parallel and currents of the MOSFETs turned on by the signals s01, s02, s04, s08, s16 and s32 may be added.

Figure 5:
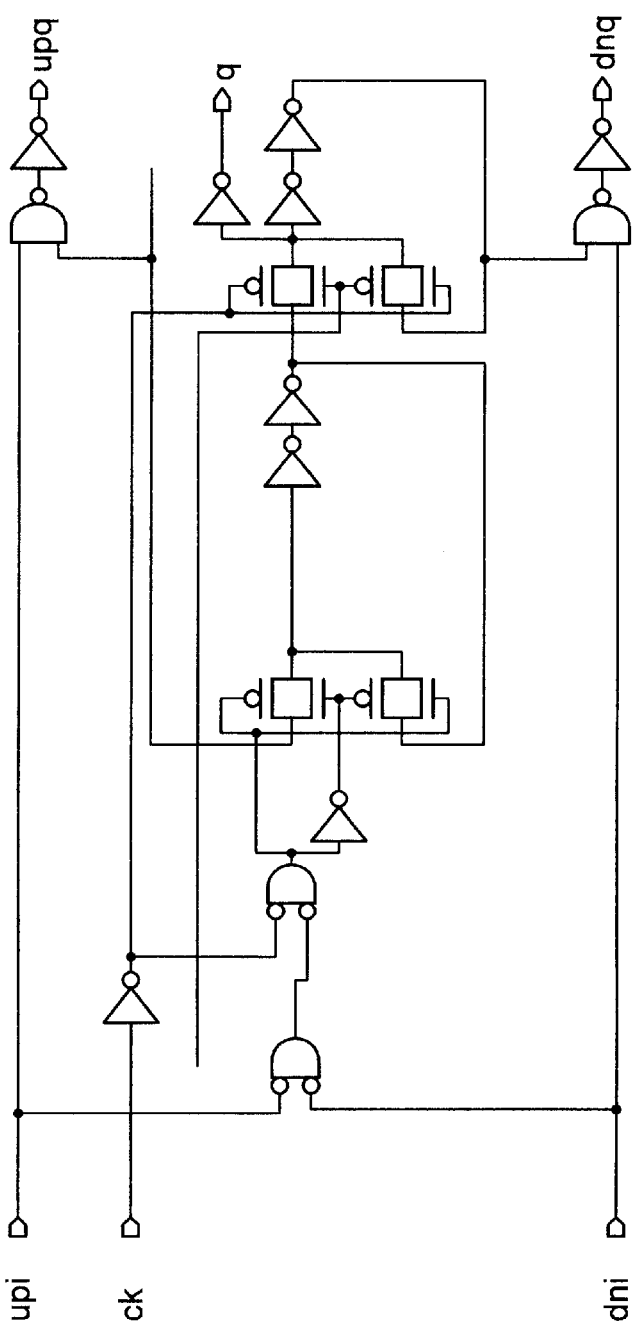
FIG. 5 is a circuit diagram schematically illustrating an embodiment of an up/down counter of FIG. 4.

FIG. 5 is a circuit diagram illustrating an embodiment of an up/down counter. FIG. 5 illustrates such a circuit for 1 bit by example as representative. The circuit produces an output signal q, an up-carry signal upq transmitted to a next stage circuit and a down-carry signal snq in response to an up input signal upi, a down signal dni and a clock signal ck supplied from the phase comparator or a preceding circuit.

FIG. 6 is a circuit diagram illustrating an embodiment of a variable delay circuit for trimming used in a memory circuit included in a semiconductor integrated circuit device according to the present invention. In the embodiment, the variable delay stage corresponding to the SA activation signal A and the variable delay stage corresponding to a signal B on the dummy bit lines are illustrated by example. The two variable delay stages are constituted by the same circuit. That is, output signals of three clocked inverters constituting a selector are made common to be produced as an output Aq (Bq) through an inverter circuit. An output of an inverter circuit supplied with an input signal A(B) is supplied to an input of the clocked inverter circuit corresponding to a selection signal S1, of the three clocked inverter circuits. The output of the inverter circuit supplied with the input signal A(B) is further supplied to two stage inverter circuits and an output of the two stage inverter circuits is supplied to an input of the clocked inverter circuit corresponding to a selection signal S2. The output of the inverter circuit supplied with the input signal A(B) is further supplied to four stage inverter circuits and an output of the four stage inverter circuits is supplied to an input of the clocked inverter circuit corresponding to a selection signal S3.

As described above, delay signals having delay times increased by two stages of the inverter circuits are supplied to the respective inputs of the three clocked inverter circuits. The variable delay stage corresponding to the SA activation signal A is set to have an intermediate delay time when the selection signal S1 is set to low, the signal S2 to high and the S3 to low. On the contrary, with respect to the control signals S1 to S3 of the variable delay stage corresponding to the signal B on the dummy bit lines, any one of the signals S1 to S3 can be selected by trimming to thereby obtain the delay signal Bq identical with the SA activation signal A or advanced or delayed by two stages of the inverter circuits.

Figure 7:
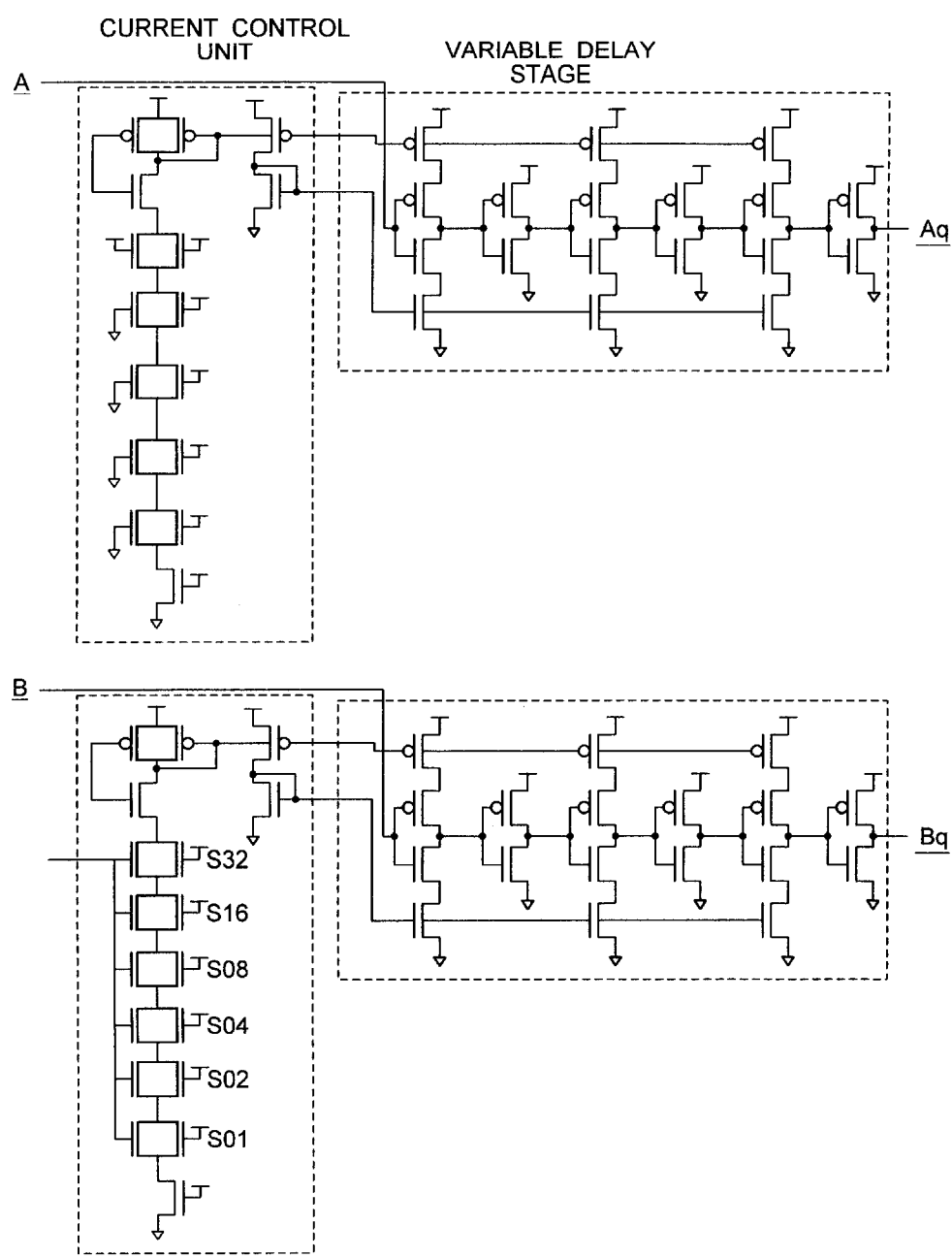
FIG. 7 is a circuit diagram schematically illustrating another embodiment of a triggering variable delay circuit used in the memory circuit included in the semiconductor integrated circuit device according to the present invention.

FIG. 7 is a circuit diagram illustrating another embodiment of a variable delay circuit for trimming used in a memory circuit included in a semiconductor integrated circuit device according to the present invention. In the embodiment, the variable delay circuit shown in FIG. 4 is used. The variable delay stage corresponding to the SA activation signal A turns on the MOSFET corresponding to s32 for setting of the current to set an intermediate current and is set to the intermediate delay time in the delay time setting range. On the contrary, the control signals s01 to s32 of the variable delay stage corresponding to the signal B on the dummy bit lines can set the aforementioned 64 kinds of delay times by a combination of s01 to s32 by the trimming to thereby obtain the delay signal Bq identical with the SA activation signal A or advanced or delayed to 32 kinds.

Figure 8:
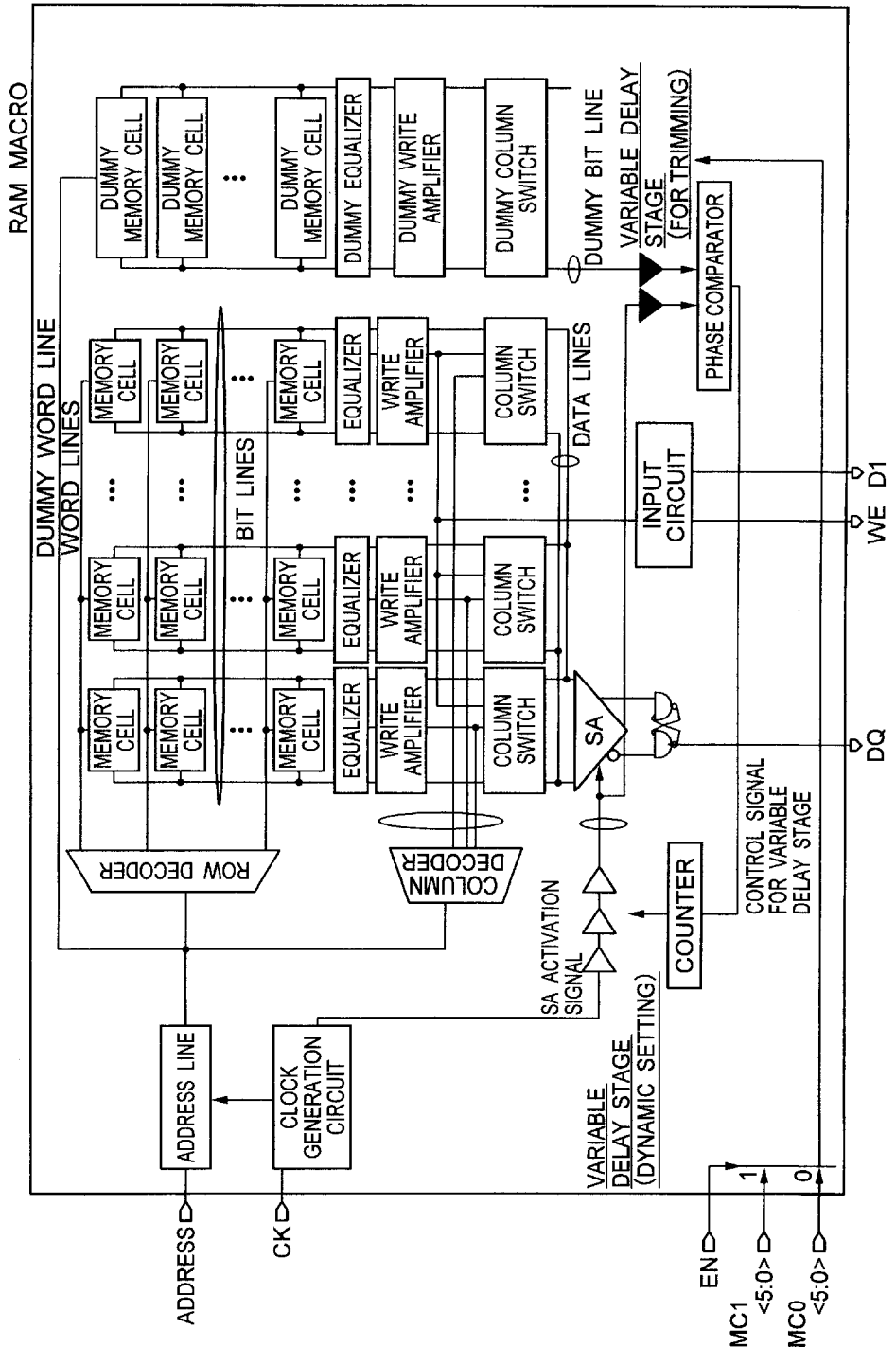
FIG. 8 is a block diagram schematically illustrating the whole of an embodiment of the memory circuit included in the semiconductor integrated circuit device according to the present invention.

FIG. 8 is a block diagram illustrating the whole of an embodiment of a memory circuit included in a semiconductor integrated circuit device according to the present invention. The memory circuit of the embodiment constitutes a RAM macro-cell included in a large-scale integrated circuit having the microcomputer function as described above and is supplied with an address signal, a clock signal CK, a write control signal WE and a write input signal DI from a logical circuit and the like included in the large-scale integrated circuit to produce a read signal DQ to such a logical circuit.

A delay time is set to the variable delay stage for trimming by signals MC1 and MC0 formed by a test circuit included therein and described later. That is, the trimming signal MC1 is selected by test operation of the testing circuit to set the variable delay stage by the signal EN. A set amount of the optimum delay time is detected by the test operation of the testing circuit in a probing process performed at the time that a circuit is completed on a wafer and the delay time of the variable delay stage for trimming is controlled by the trimming signal MC0 in the actual operation state by trimming by means of cutting of a fuse performed later.

Figure 9:
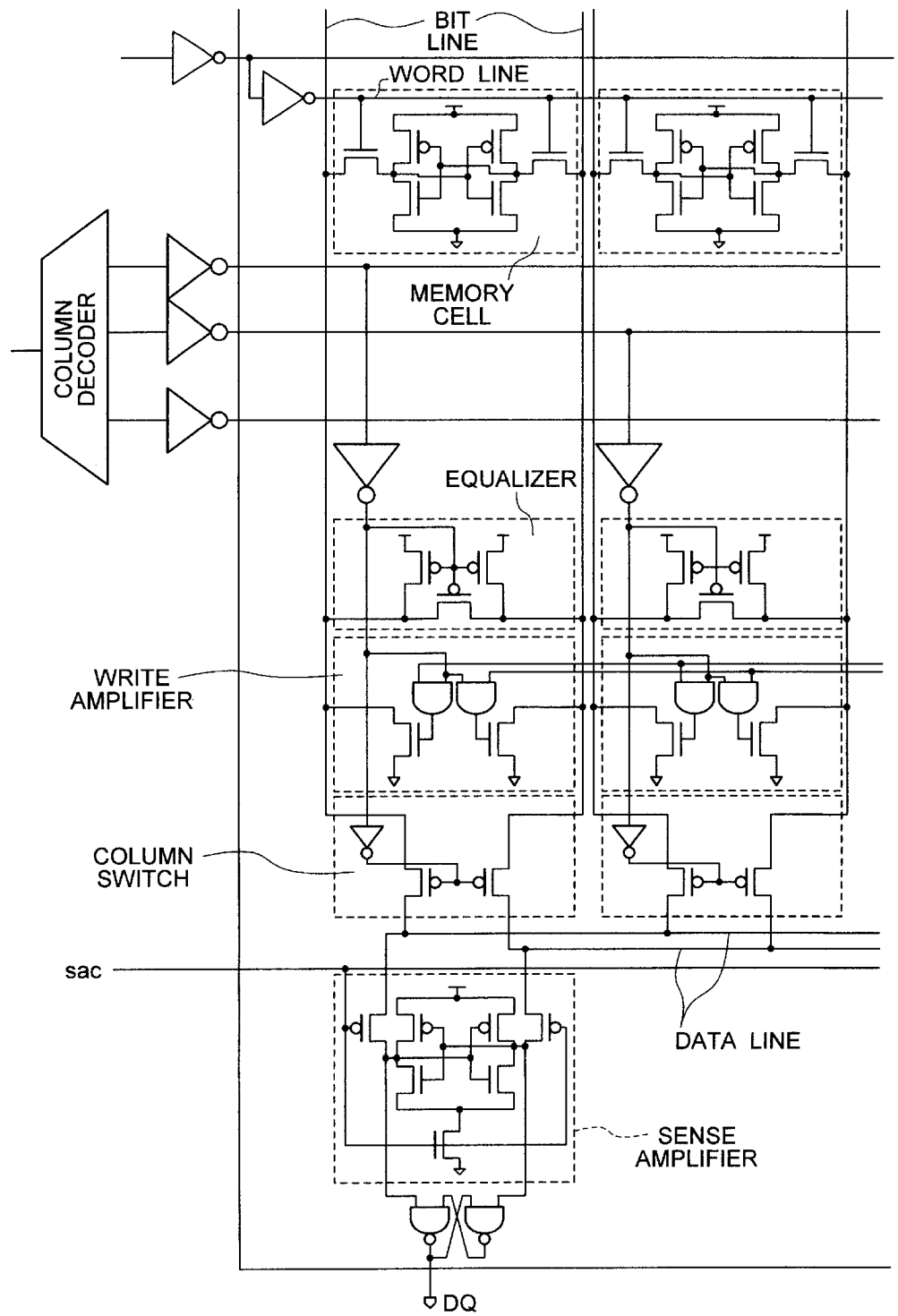
FIG. 9 is a circuit diagram schematically illustrating an embodiment of a definite main circuit provided in connection with bit lines in the memory circuit included in the semiconductor integrated circuit device according to the present invention.

FIG. 9 is a definite circuit diagram illustrating an embodiment of memory cells, equalizers, write amplifiers, column switches and a sense amplifier provided in the bit line in a memory circuit included in a semiconductor integrated circuit device according to the present invention. In FIG. 9, P-channel MOSFETs have gates to which circle ○ is added to be distinguished from N-channel MOSFETs.

The memory cell is composed of a CMOS latch circuit including CMOS inverter circuits constituted by N-channel MOSFETs and P-channel MOSFETs and having inputs and outputs cross-connected to each other and N-channel MOSFETs for address selection connected between a pair of input/output nodes of the CMOS latch and a pair of bit lines and having gates connected to the word line.

The equalizer is composed of P-channel pre-charging MOSFETs supplied with a column selection signal to pre-charge a pair of bit lines to a supply voltage or the like and a P-channel switching MOSFET for short-circuiting the pair of bit lines.

The write amplifier is composed of logical gate circuits controlled by the column selection signal to supply write data from an input circuit and N-channel driving MOSFETs driven by the logical gate circuits. That is, any one of the pair of bit lines is set to a low level such as a ground potential of the circuit in response to the write data so that the pair of bit lines is set to the pre-charged supply voltage and a CMOS level of the low level.

The column switch is composed of P-channel switching MOSFETs controlled by an output signal of an inverter circuit supplied with the column selection signal and connects the pair of bit lines and the data line.

The sense amplifier is composed of P-channel input MOSFETs controlled to be switched by the sense amplifier activation signal sac, a CMOS latch circuit including CMOS inverter circuits constituted by P-channel MOSFETs and N-channel MOSFETs and having inputs and outputs cross-connected to each other, and an N-channel MOSFET connected between sources of the N-channel MOSFETs of the CMOS circuit connected in common and the ground potential of the circuit for conducting an operation current to the CMOS latch circuit in response to the sense amplifier activation signal sac. Outputs of the sense amplifier are connected to a latch circuit composed of two logical gate circuits.

Figure 10:
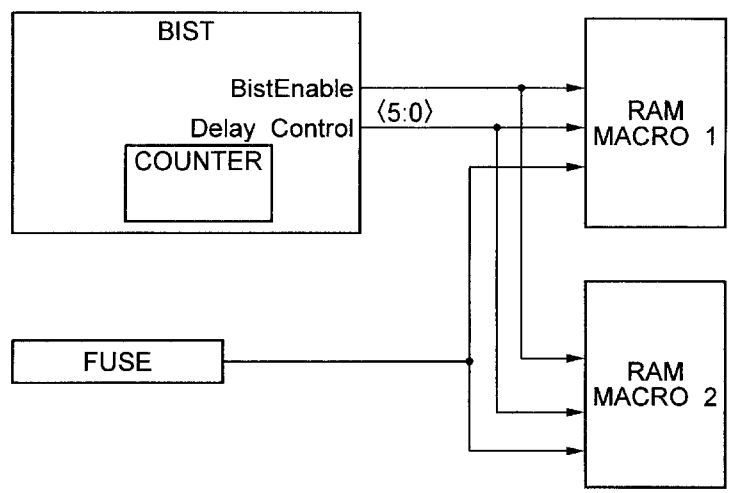
FIG. 10 is a block diagram schematically illustrating a semiconductor integrated circuit device according to the present invention.

FIG. 10 is a block diagram schematically illustrating a semiconductor integrated circuit device according to the present invention. In the embodiment, although not limited particularly, a testing circuit (BIST) and a fuse circuit (FUSE) are provided for a plurality of RAM macro-cells 1 and 2. A delay control signal is formed by the testing circuit and an optimum delay time is detected by the testing circuit to thereby obtain cutting information for a fuse of the fuse circuit.

Figure 11:
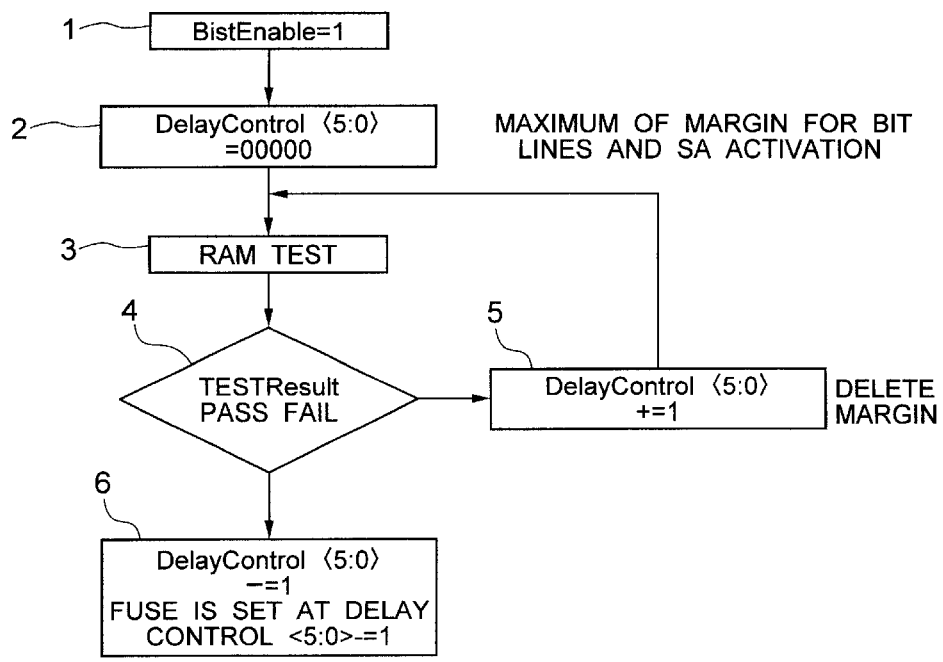
FIG. 11 is a flow chart explaining a method of adjusting an activation signal of a sense amplifier of the semiconductor integrated circuit device according to the present invention.

FIG. 11 is a flow chart explaining an adjustment method of an activation signal of a sense amplifier of a semiconductor integrated circuit device according to the present invention. In step 1, operation is set to a test mode using the testing circuit. In step 2, the delay time of the trimming delay stage is set to a maximum of margin for the bit lines and the SA activation timing. That is, a count of a counter for forming a trimming signal is set to a maximum value of the margin such as 00000.

In step 3, a reading test of the RAM macro-cell is performed on condition of the above setting of the time. In step 4, if a test result is good (PASS), a count of the counter for forming the trimming signal is incremented by 1 in step 5, so that the time margin is reduced by one step of the delay time and the above steps 3 and 4 are repeated.

In step 4, if it is judged as failure (FAIL), a count of the counter for forming the trimming signal is decremented by 1 to return to the state just before judged as failure, that is, the state judged as good (PASS). Cutting of the fuse is made in accordance with such a count in step 6. Consequently, the time margin can be set to the minimum automatically.

Figure 12:
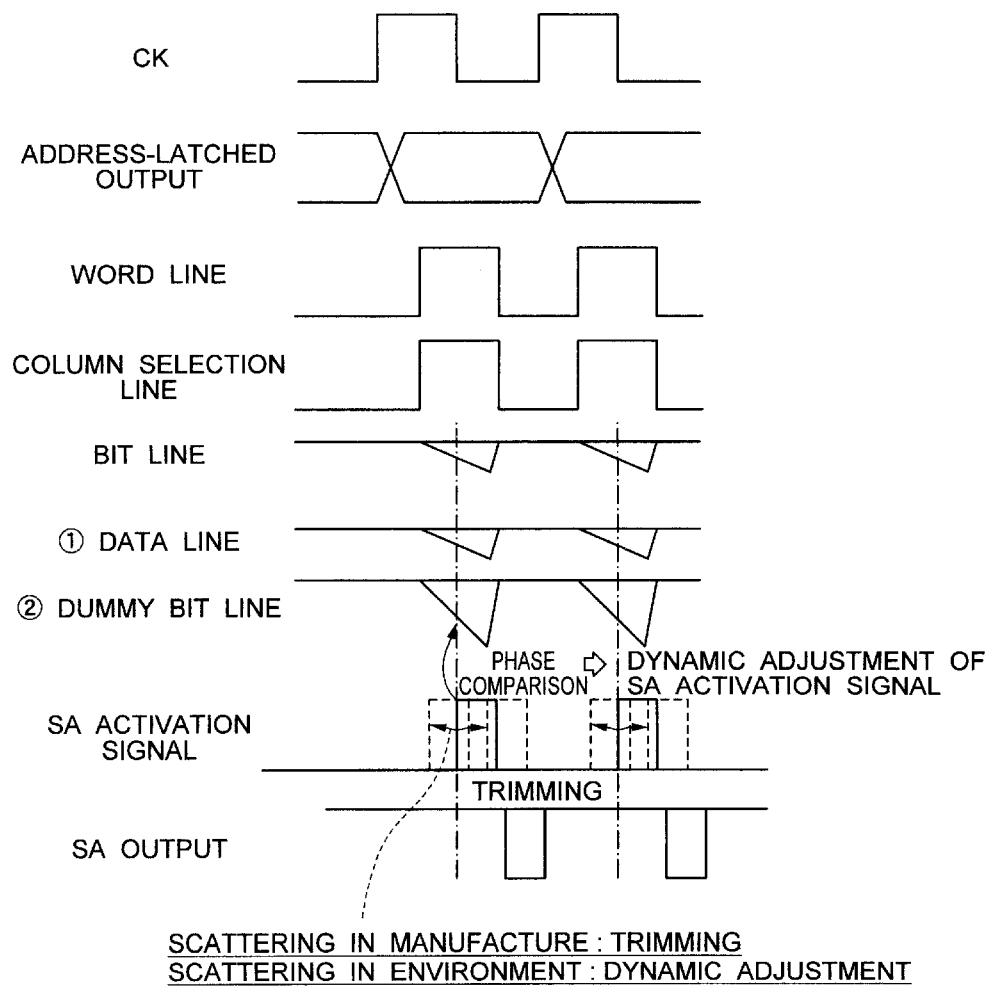
FIG. 12 is a timing diagram explaining an example of operation of a memory circuit included in the semiconductor integrated circuit device according to the present invention.

FIG. 12 is a timing diagram explaining an example of operation of a memory circuit included in a semiconductor integrated circuit device according to the present invention. A memory cycle is implemented in response to the clock signal CK. That is, an address signal is latched in response to the clock signal, and selection of the word line and selection of the column (selection of the bit line) are performed in response to the clock signal. A read signal appeared on the bit lines by selection of the word line is transmitted onto the data line by selection of the column. A signal is produced from the dummy bit lines in response to the read signal on the data line and is compared in phase with the SA activation signal to dynamically adjust the SA activation signal. That is, the SA activation signal is automatically formed so that a differential voltage obtained on the data line is equal to an input signal amount required for operation of the sense amplifier.

When the timing of the SA activation signal is shifted before or behind by scattering in a process as shown by dotted line of FIG. 12, the timing of the SA activation signal is adjusted by trimming to be coincident with the optimum timing in the phase-comparison operation. Consequently, the margin for process and variation in environment can be deleted to thereby attain high-speed memory operation substantially.

Figure 13:
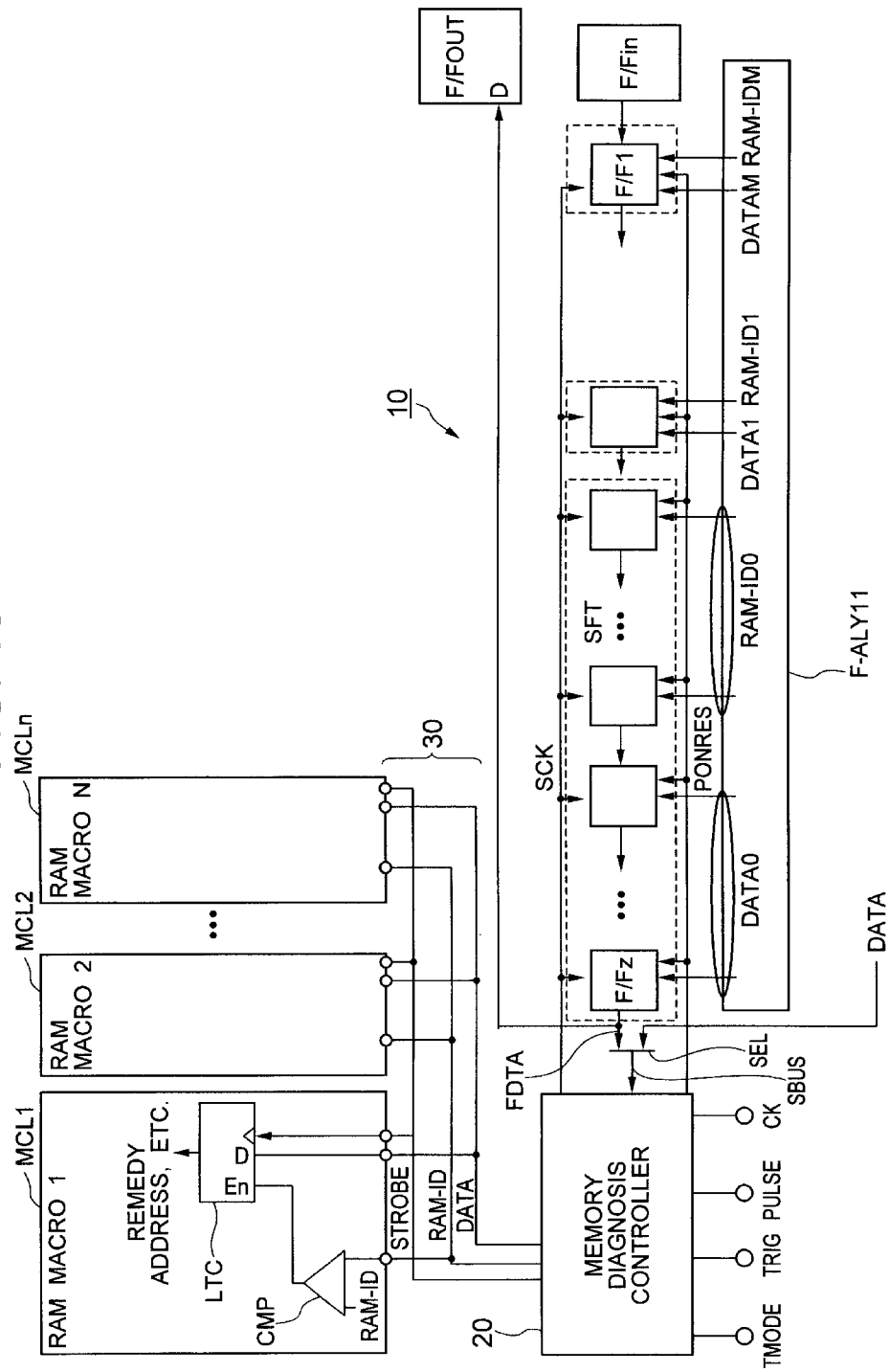
FIG. 13 is a block diagram schematically illustrating the whole of an embodiment of the semiconductor integrated circuit device according to the present invention.

FIG. 13 is a block diagram schematically illustrating the whole of an embodiment of a semiconductor integrated circuit device according to the present invention. Each of a plurality of memory blocks MCL1, MCL2, . . . , MCLn included in a chip constituting the semiconductor integrated circuit device is previously assigned with an identification code (ID code) and includes a comparator CMP for comparing the identification code with an inputted identification code (RAM-ID) and a latch circuit or a holding circuit LTC for latching information (Data) such as an address inputted when the identification codes are identical with each other.

There are provided a setting circuit 10 for specifying remedy addresses (Data 0 to Data M) and memory blocks for remedying the plurality of memory blocks MCL1, MCL1, . . . , MCLn in a place or location different from the memory blocks and setting identification codes (RAM-ID0 to RAM-IDM) in pair for implementing trimming of the delay circuit as described above, and a memory diagnosis controller 20 serving as a control circuit for controlling the setting circuit 10.

The setting circuit 10 includes a fuse array F-ALY11 in which fuses functioning as program elements capable to be programmed externally are arranged side by side and a shift register SFT for reading states of the respective fuses to transfer information concerning the states in series. The memory diagnosis controller 20 reads in set information from the setting circuit 10 through a serial bus SBU in series to convert it into parallel data and supplies the parallel data to the memory blocks MCL1, MCL2, . . . , MCLn through a memory control bus 30 constituting a parallel bus to thereby latch the remedy address automatically.

A selector SEL is connected between the setting circuit 10 and the memory diagnosis controller 20 to supply any of data FDATA from the setting circuit 10 and data DATA from an external terminal to the memory diagnosis controller. Thus, when any defective bit is detected newly in any of the memory blocks during operation of the system, the data DATA supplied externally is sent to the memory block where the defective bit is detected instead of the data FDATA from the setting circuit 10 to be latched, so that the failure can be repaired without exchange of a chip or addition of a program to the fuses and trimming for adjustment of the timing of the activation signal of the sense amplifier can be performed.

In order to make it possible to detect the presence of failure of the shift register itself constituting the setting circuit 10, a data output terminal of a test data input flip-flop F/Fin is connected to a data terminal of a flip-flop F/F1 provided at a first stage thereof. Further, a data output terminal of a flip-flop F/Fz provided at a final stage of the shift register is connected to a data input terminal of a test data output flip-flop F/Fout. Thus, for example, "1" or "0" is set to the test data input flip-flop F/Fin to be shifted along the shift register and whether data latched finally in the test data output flip-flop F/Fout is identical with the input data or not is judged, so that whether the shift register is operated normally or not can be detected.

The test data input/output flip-flops F/Fin and F/Fout can be disposed on a scan path used for boundary scan test or test of a logic portion, for example, to thereby perform setting of test data and reading of a test result without providing any special structure separately. Further, instead of the provision of the test data input/output flip-flops F/Fin and F/Fout, an external terminal for inputting/outputting the test data may be provided to input the test data directly or observe the test result.

Figure 14:
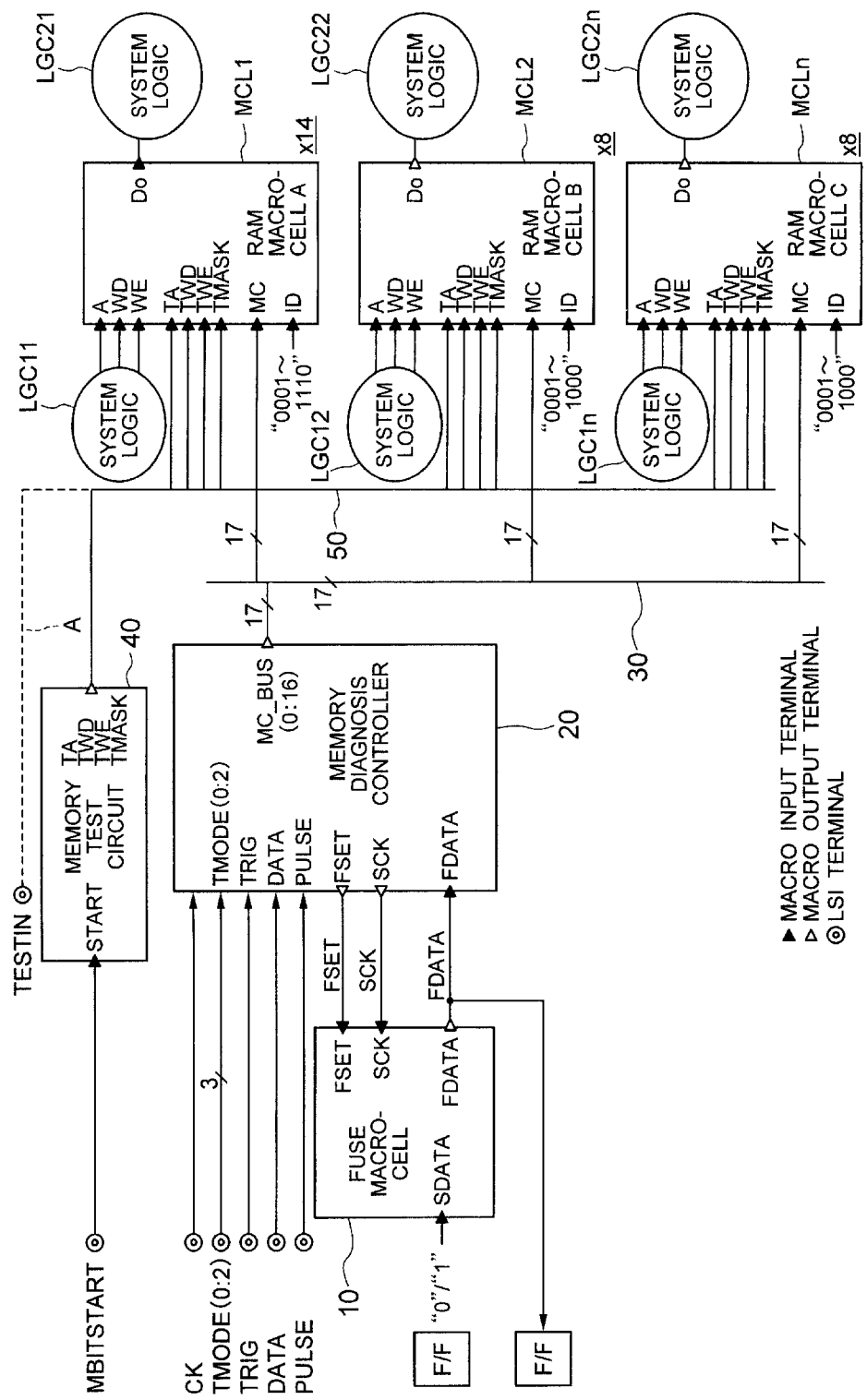
FIG. 14 is a schematic diagram illustrating the semiconductor integrated circuit device to which the present invention is applied.

FIG. 14 is a schematic diagram illustrating a semiconductor integrated circuit device to which the present invention is applied. All of circuit blocks illustrated in FIG. 14 are formed on a single semiconductor chip such as a monocrystalline silicon. What mark ⊙ indicates represents pads constituting external terminals provided in the semiconductor chip. The external terminals shown in the drawing merely indicate those related to the present invention among the external terminals provided actually and the chip is provided with external terminals for fulfilling the original function of the chip and power supply terminals in addition to the above external terminals.

Reference marks MCL1, MCL2, . . . , MCLn represent RAM macro-cells constituting built-in memories and LGC11, LGC12, . . . , LGC2n represent logical circuits for realizing the original logical functions (system logic) of the chip. The RAM macro-cells MCL1, MCL2, . . . , MCLn include a preliminary memory column substituted for defective bit, a substitution control circuit, a variable delay circuit to be trimmed, a test auxiliary circuit for facilitating memory test and the like in addition to the memory array, the decoder circuit for selection and the reading/writing circuit as described above.

In the specification, the RAM macro-cells mean the memory circuits which are previously designed and operation of which is confirmed and mean those selected as having desired memory capacity and performance from a plurality of RAMs registered in a database or the like so that the selected cells are merely disposed on the chip and having the detailed circuit design that can be omitted. Such macro-cells include circuits used generally in ROMs and logical LSIs for logical operation circuits, PLL (Phase Locked Loop) circuits, clock amplifiers and the like in addition to the RAMs.

In the embodiment, there are provided the setting circuit 10 including the fuse array for setting information for identifying the RAM macro-cells MCL1, MCL2, . . . , MCLn, defective address information and the trimming, the memory diagnosis controller 20 having the function of producing a control signal FSET and a shift clock signal SCK to the setting circuit 10 on the basis of a test mode setting signal TMODE (0:2), a trigger signal TRIG and a control pulse PULSE supplied externally, the function of reading in information FDATA set in the setting circuit 10 to control the timing of transferring it to the RAM macro-cells MCL1, MCL2, . . . , MCLn and the function of converting serial set information into parallel information, and the dedicated memory control bus 30 for supplying the set information from the memory diagnosis controller 20 to the RAM macro-cells MCL1, MCL2, . . . , MCLn.

Although not limited particularly, the memory control bus 30 is formed of 17 bits and the test mode setting signal TMODE (0:2) is outputted as 3 bits thereof as it is. Information relative to setting and read in from the setting circuit 10 to be transferred to the RAM macro-cells MCL1, MCL2, . . . , MCLn is outputted as 13 bits thereof, and a signal for giving a timing for latching the setting information is outputted as one remaining bit.

In the embodiment, there is provided a memory test circuit 40 including a pattern generator for generating a test pattern for testing the RAM macro-cells MCL1, MCL2, . . . , MCLn included in the chip. The pattern generator can utilize a circuit of an FSM (finite state machine) system or a micro-programming system. Such a memory test circuit merely uses the technique already established as the BIST (Bulit-In Self-Test) technique and detailed description thereof is omitted. The memory test circuit 40 produces the test pattern or a test control signal to supply it to the RAM macro-cells MCL1, MCL2, ..., MCLn through a test signal line 50 when a start signal MBISTSTART of a memory test is supplied externally.

Instead of the memory test circuit 40 formed on the chip, an input terminal TESTIN for test connected to the test signal line 50 as shown by broken line A may be provided so that a signal similar to the test pattern and the test control signal or a fixed pattern produced in an external memory test circuit may be inputted to test the RAM macro-cells MACL1, MACL2, ..., MCLn.

Figure 15:
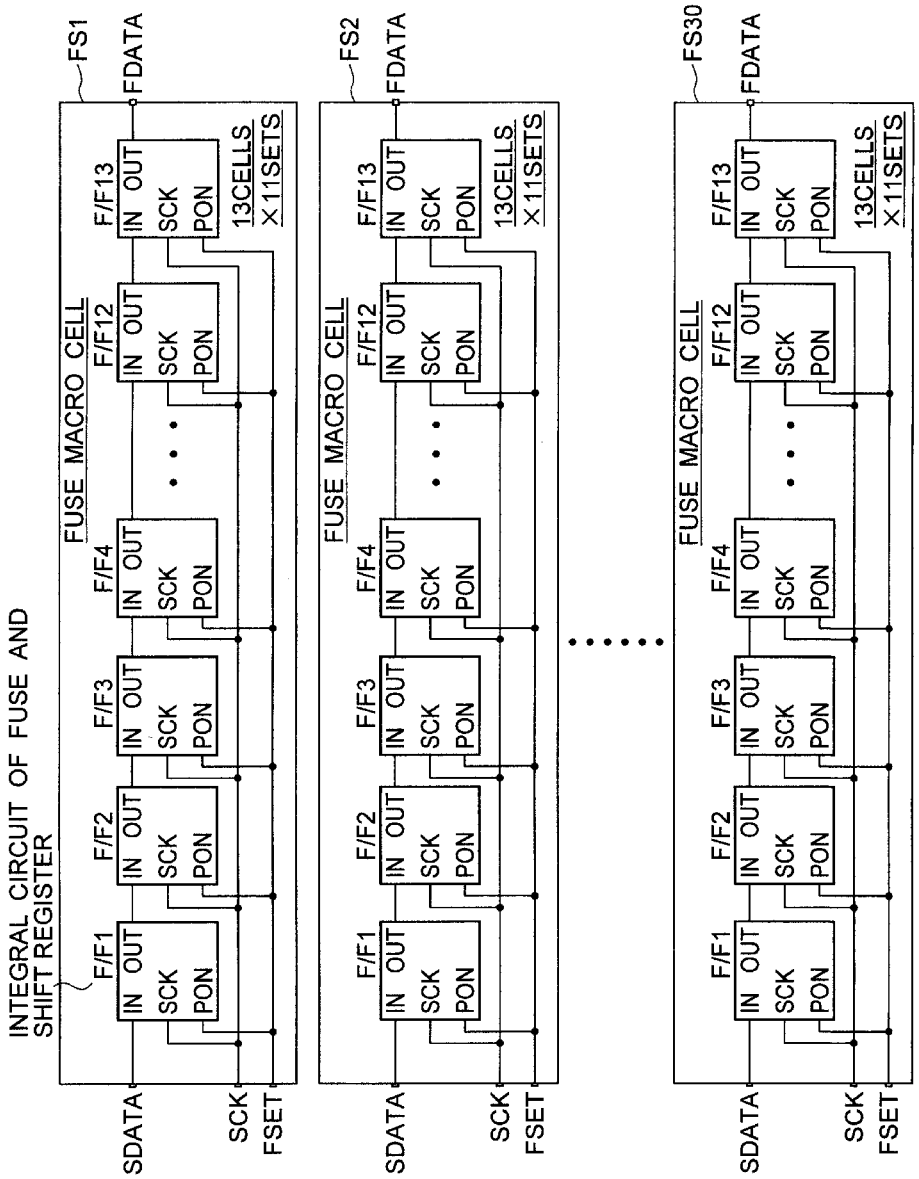
FIG. 15 is a schematic diagram illustrating a shift register constituting a setting circuit of FIG. 14.

FIG. 15 shows an example schematically illustrating a shift register constituting the setting circuit. In FIG. 15, each flip-flop is represented as a fuse-included flip-flop. The shift register of the embodiment includes 30 fuse sets FS1 to FS30 each having 13 cascade-connected flip-flops F/F1 to F/F13 and the fuse sets are further cascade-connected so that data held therein is shifted one bit by one bit in response to a shift clock SCK applied in common to each flip-flop. The signal FSET is a fuse set signal supplied to all of the flip-flops for taking in a state of its internal fuse to be held.

Figure 16:
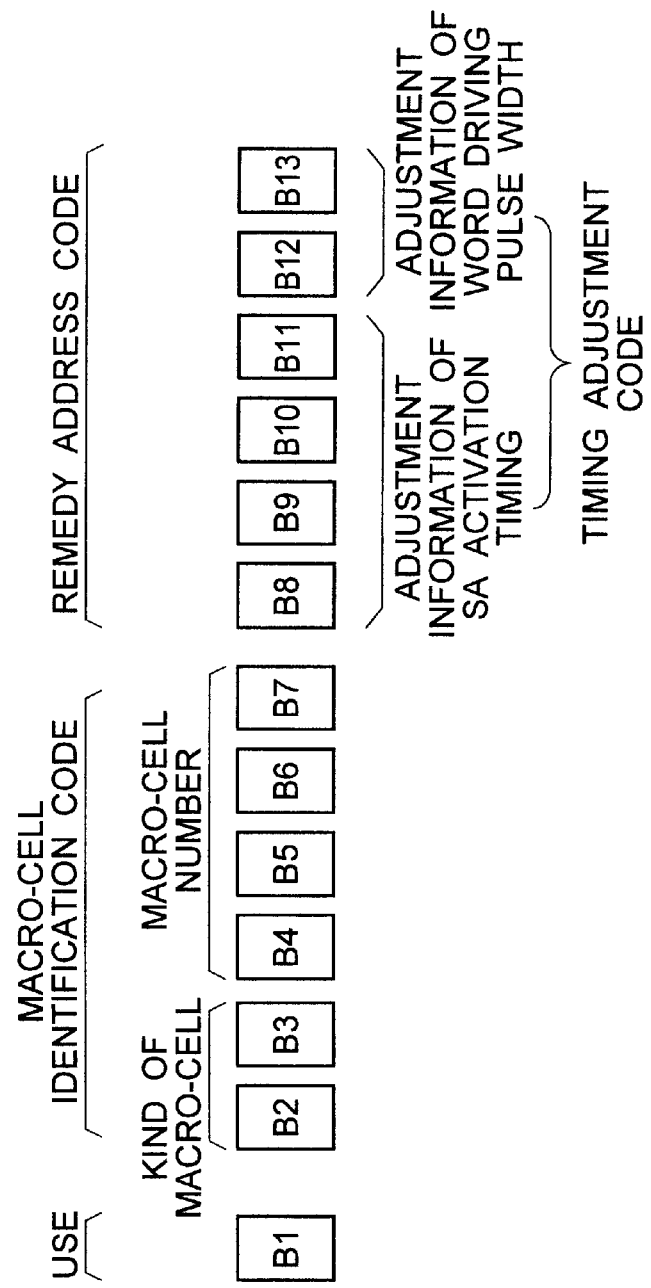
FIG. 16 illustrates a bit structure for explaining the shift register of FIG. 15.

The 13 flip-flops F/F1 to F/F13 in one fuse set include, as shown in FIG. 16, a bit B1 indicating usage, bits B2 to B7 indicating an identification code of the RAM macro-cell and bits B8 to B13 indicating a remedy address code or a timing adjustment code. The bit B1 indicates whether the code of the bits B8 to B13 represents the remedy address code or the timing adjustment code. Concretely, when the bit B1 is "0", the code of B8 to B13 represents the remedy address code and when the bit B1 is "1", the code of B8 to B13 represents the timing adjustment code. When the code of B8 to B13 is the timing adjustment code, front 4 bits represents adjustment information of the activation timing of the sense amplifier and rear 2 bits represents adjustment information of a pulse width of a word driving pulse.

Further, the bits B2 to B7 indicating the identification code of the RAM macro-cell includes bits B2 and B3 representing a kind of macro-cell and bits B4 to B7 representing a macro-cell number. For example, when the bits B2 and B3 are "00", the bits represent that a designated RAM macro-cell includes a memory capacity of 4 kilo-words, when the bits B2 and B3 are "01", the bits represent that a designated RAM macro-cell includes a memory capacity of 2 kilo-words, and when the bits B2 and B3 are "10", the bits represent that a designated RAM macro-cell includes a memory capacity of 1 kilo-word.

Further, when the bits B2 and B3 are "11", the bits represents that all of the RAM macro-cells are designated. The designation of the RAM macro-cell by the bits B2 and B3 is effective mainly when the bit B1 is "1" and the bits B8 to B13 represent the timing adjustment code. This reason is that it is preferred that the timing is adjusted collectively since the same kind of RAMs within the same chip have the characteristics resembling one another.

Although not limited particularly, the "word" of the embodiment means data having a bit length of 36 bits. The kinds of RAM macro-cells are not limited to those shown in Table 1. It is not necessary that the word length is 36 bits and a word length may be different depending on a cell.

Figure 17:
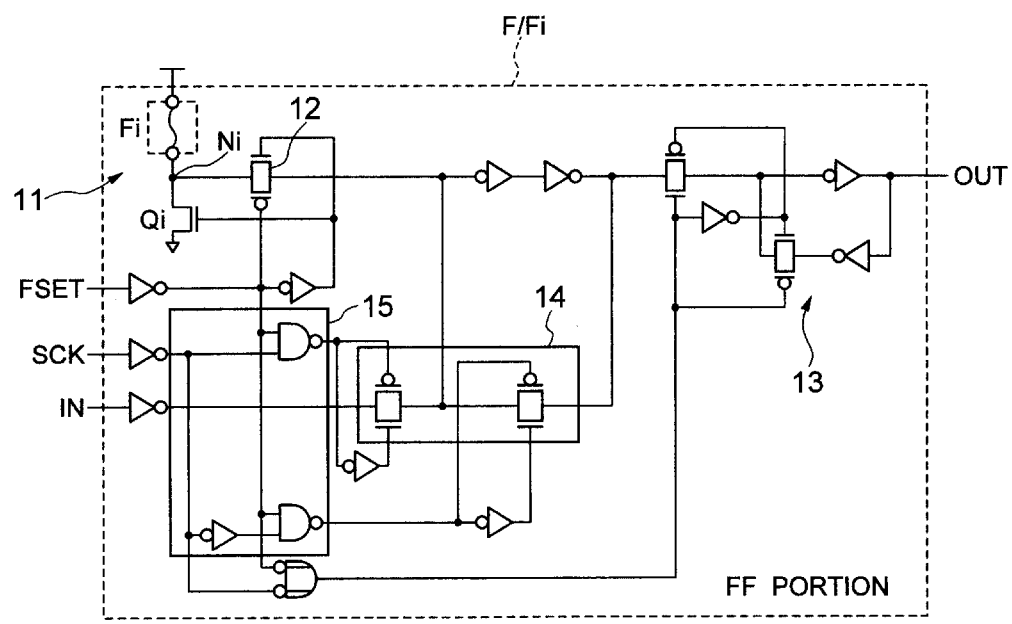
FIG. 17 is a definite circuit diagram schematically illustrating an embodiment of a flip-flop including a fuse and constituting a setting circuit having the shift register function of FIG. 15.

FIG. 17 schematically illustrates a definite example of the flip-flops F/F1 to F/F13 including a fuse constituting the setting circuit 10 having the shift register function of FIG. 15. Each flip-flop includes a state setting portion 11 composed of a fuse Fi and a MOSFET Qi connected in series to the fuse for producing a potential (Vcc or GND) in accordance with a state (cut or non-cut) of the fuse Fi at its connection node Ni, a transfer gate 12 for transmitting a set potential of the state setting portion 11 to the inside of the flip-flop in response to the fuse set signal FSET supplied from the memory diagnosis controller 20, a latch circuit 13 for holding the potential state transmitted by means of the transfer gate 12, and a transfer gate 14 for transmitting data inputted to a data input terminal IN to the latch circuit 13 or cutting off the data not to be transmitted to the latch circuit 13.

There is provided a logical circuit 15 for forming a signal for controlling the transfer gate 14 so that data inputted to the data input terminal IN is transmitted to the latch circuit 13 in synchronism with the shift clock supplied from the memory diagnosis controller 20 when the fuse set signal FSET is negated to be low.

Figure 18:
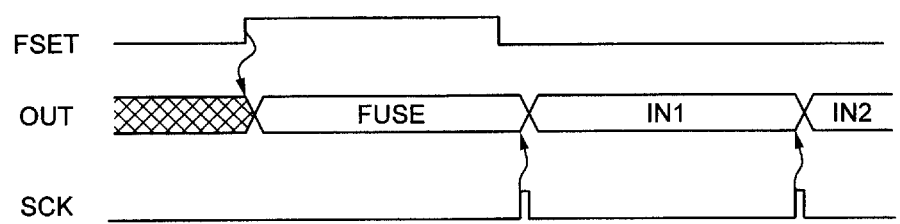
FIG. 18 is a timing circuit for explaining operation of the flip-flop of FIG. 17.

The flip-flop including the fuse of FIG. 17 constituting the setting circuit 10 having the shift register function is operated to latch a state FUSE of the fuse in the latch circuit 13 when the fuse set signal FSET is asserted to be high as shown in FIG. 18 and to latch data inputted to the data input terminal IN in the latch circuit 13 in synchronism with a rising edge of the shift clock SCK when the shift clock SCK is inputted in case where the fuse set signal FSET is negated to be low. The data latched in the latch circuit 13 is supplied from an output terminal OUT thereof to a data input terminal IN of a flip-flop of a next stage.

Accordingly, in the circuit of the embodiment, the fuse set signal FSET is first changed to a high level to latch the state FUSE of the fuse in the latch circuit 13 and the shift clock SCK is then changed in succession, so that the data held in the flip-flops can be shifted to the next-stage flip-flop successively. The reason why the transfer gate 14 is constituted by two stage gates is that the data inputted to the data input terminal IN is prevented from being outputted from the output terminal as it is, that is, a so-called racing is prevented.

Figure 19:
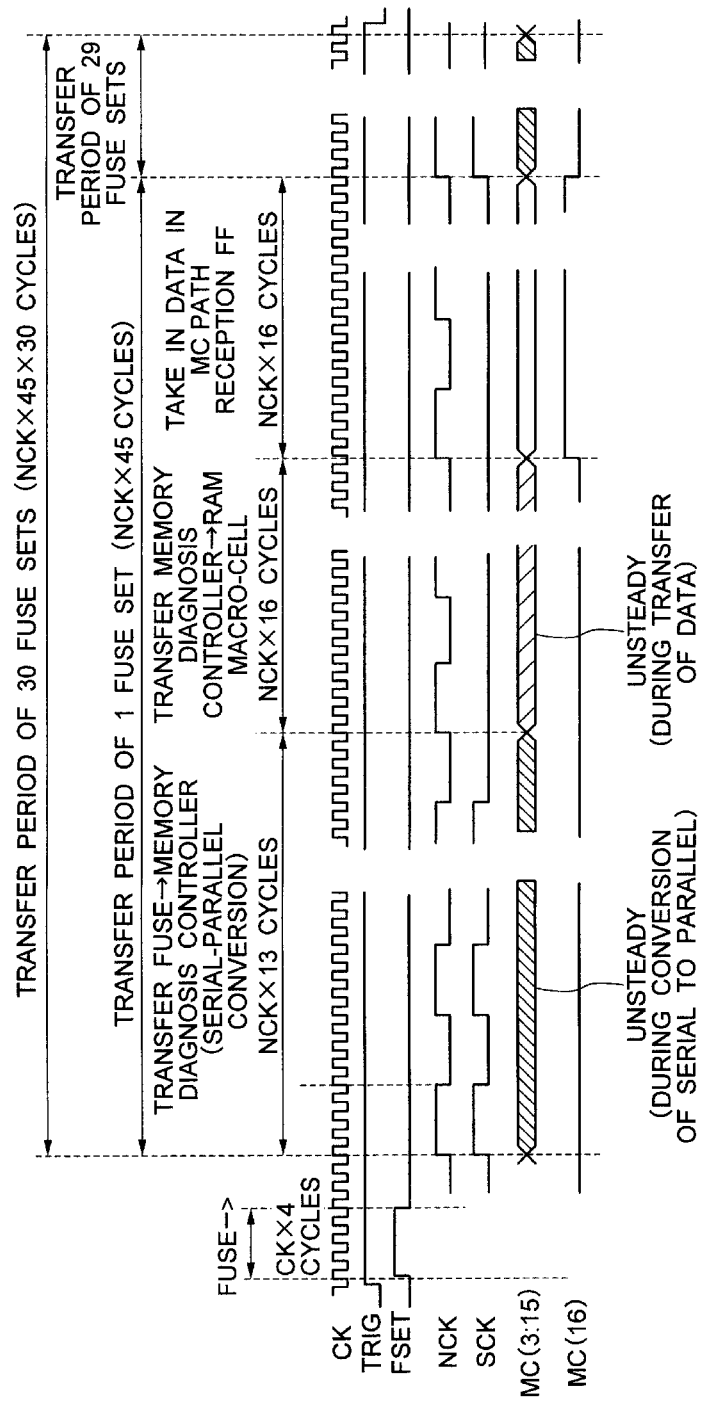
FIG. 19 is a timing circuit for explaining operation of a memory diagnosis controller of FIG. 14.

FIG. 19 shows a relation of the clock signal CK, the trigger signal TRIG, the fuse set signal FSET, the shift clock SCK, the bus output signals MC3 to MC15 and MC16. The shift clock SCK is outputted during 13 cycles of an internal clock NCK to take in serial data from the fuse setting circuit 10 and a signal is outputted on the memory control bus 30 from the memory diagnosis controller 20 during next 16 cycles. During this operation, the signal B3 to B9 indicating the macro-cell number is decoded in the RAM macro-cell to judge whether it is directed to the RAM macro-cell itself or not. During subsequent 16 cycles, an information signal B10 to B15 on the memory control bus 30 to the RAM macro-cell is latched. The above operation requiring 45 cycles in total is repeated by 30 times corresponding to the number of fuse sets, so that the set information of all the fuses are transferred to the corresponding RAM macro-cells.

Figure 20:
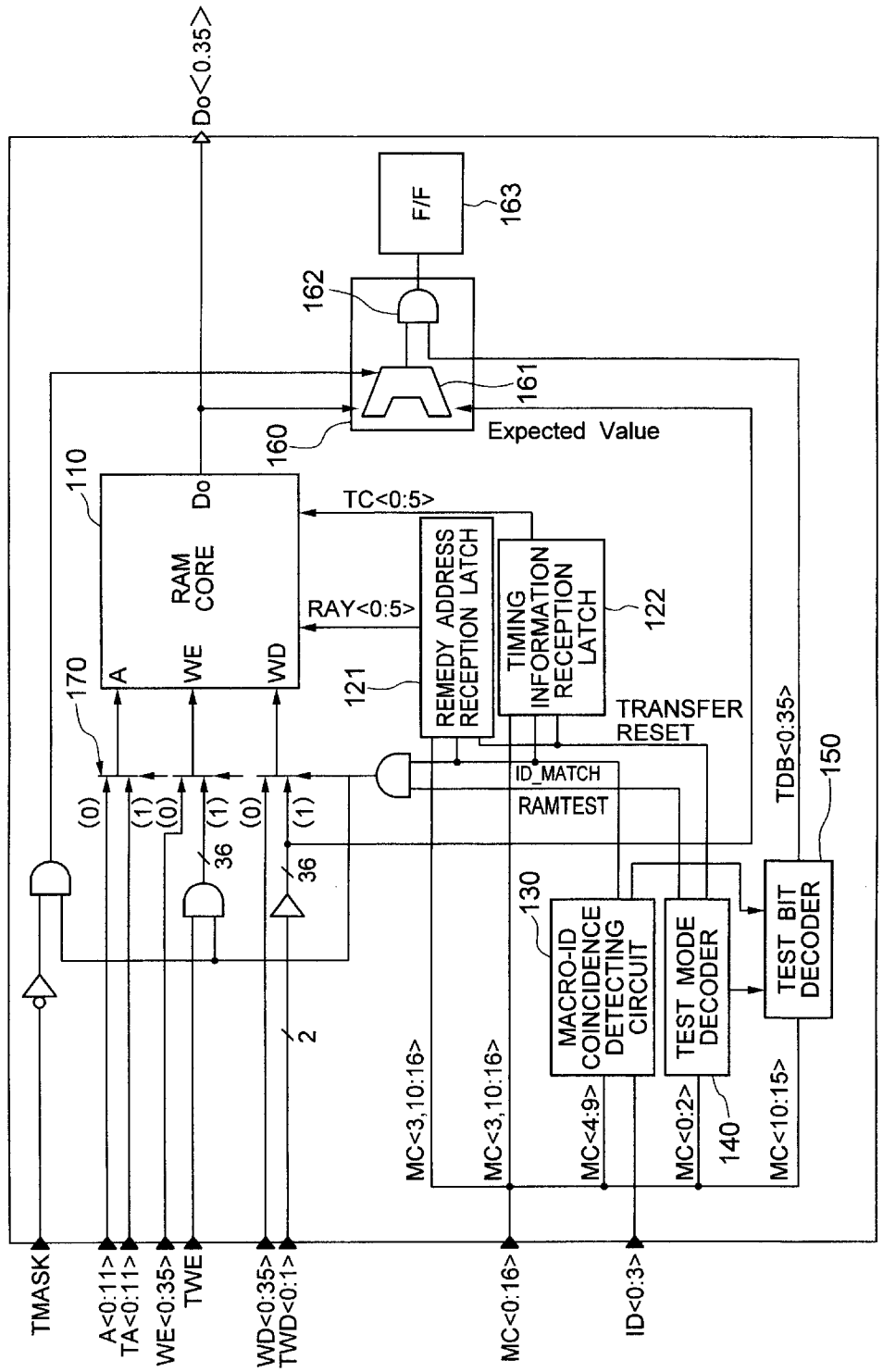
FIG. 20 is a block diagram schematically illustrating an embodiment of a RAM macro-cell of FIG. 14.

FIG. 20 is schematic diagram illustrating an embodiment of a RAM macro-cell included in a semiconductor integrated circuit device according to the present invention. The RAM macro-cell MCL of the embodiment includes a RAM core 110 having a memory array containing a plurality of memory cells arranged in a matrix and a peripheral circuit such as a redundant circuit and the like, a remedy address reception latch circuit 121 for taking in the remedy address for substituting the preliminary memory cell for a defective bit within the RAM core 110 from the memory control bus 30 to be held, and a timing information reception latch circuit 122 for taking in timing information for adjusting the timing (activation signal of the sense amplifier) of the signal within the RAM core 110 from the memory control bus 30 to be held.

Further, the RAM macro-cell MCL includes a macro-ID coincidence detecting circuit 130 for detecting whether an identification code (macro-ID) of a RAM macro-cell supplied from the memory control bus 30 is coincident with a code previously assigned to the RAM macro-cell itself or not, a test mode decoder 140 for decoding the test mode signal supplied from the memory control bus 30 to produce a control signal in accordance with a mode, a test bit decoder 150 for decoding a code (MC10 to MC15) supplied from the memory control bus 30 upon the test mode to produce a signal TDB0 to TDB35 for designating a bit to be tested, a test result comparison and judgment circuit 160 for comparing read data with expected data upon the test mode to judge whether both the data are coincident with each other or not, and a selector group 170 for selecting any of the address signal A, the read/write control signal WE and the write data WD supplied from the system logical circuit constituting the original function of the LSI or the address signal TA, the read/write control signal TWE and the test write data TWD supplied from the memory test circuit 40.

Figure 21:
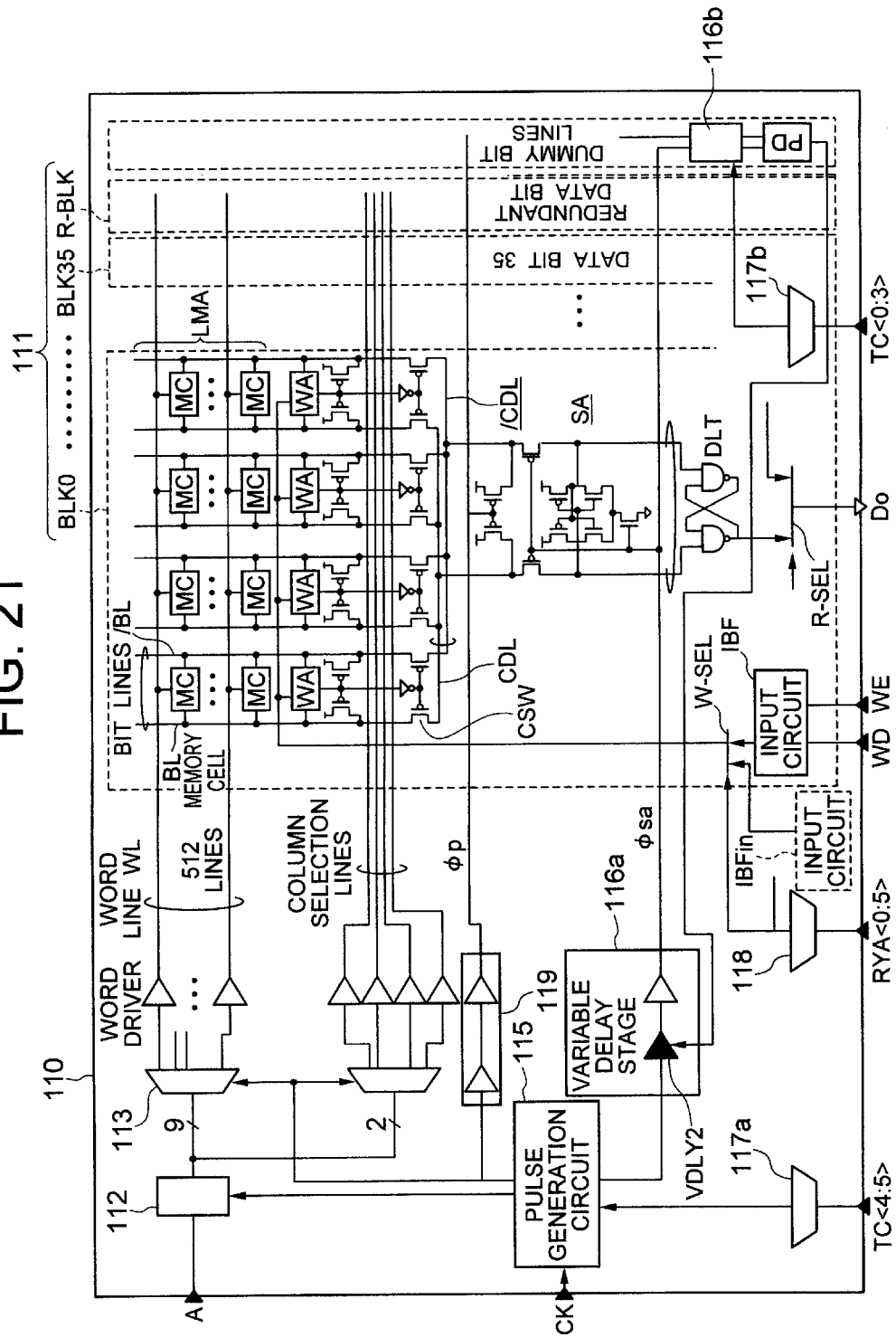
FIG. 21 is a schematic diagram illustrating an embodiment of a RAM core of the RAM macro-cell of FIG. 20.

FIG. 21 illustrates an example of a definite configuration of the RAM core 110. The RAM core 110 of the embodiment includes a memory array 111 having a plurality of memory cells MC arranged in a matrix, an address latch circuit 112 for latching an inputted address signal, a row address decoder 113 for decoding the row address signal to select one word line WL within the memory array in a corresponding manner to the row address signal, a column address decoder 114 for decoding the inputted column address signal to select bit lines BL and /BL within the memory array, a pulse generating circuit 115 for generating a write pulse and the like, and a variable delay circuit 116a for delaying the signal generated by the pulse generating circuit 115 to produce the activation signal φsa of the sense amplifier within the memory array. The variable delay circuit 116a has a delay time controlled by an output signal of the phase comparator PD supplied with the signal on the dummy bit lines and the SA activation signal φsa.

The RAM core 110 further includes an adjustment decoder 117a for decoding signals TC4 and TC5 of timing adjustment signals TC0 to TC5 supplied from the timing information reception latch circuit 122 to produce an adjustment signal to the pulse generating circuit 115, an adjustment decoder 117b for decoding signals TC0 to TC3 of the timing adjustment signals TC0 to TC5 to produce an adjustment signal to the variable delay circuit 116b for trimming, a redundancy decoder 118 for decoding the remedy address RYA0 to RYA5 supplied from the remedy address reception latch circuit 121 to produce a switching signal of the selector, and a timing circuit 119 for producing a precharging signal φp for common data CDL and /CDL within the memory array on the basis of the signal generated by the pulse generating circuit 115.

The memory array 111 is composed of 36 memory blocks BLK0 to BLK35 corresponding to 36-bit data which is read and written at a time and a redundant or preliminary memory block R-BLK. Each memory block includes a local memory array LMA, column switches CSW for connecting a pair of bit lines selected in the local memory array LMA to the data lines CDL and /CDL, a sense amplifier SA for amplifying a data signal read out from the memory cell onto the data lines CDL and /CDL, a data latch circuit DLT for latching the read data amplified by the sense amplifier SA, write amplifiers WA for writing data into a selected memory cell on the basis of the read/write control signal WE and the write data WD, an input circuit IBF for taking in the write data WD and the read/write control signal WE, a write selector W-SEL for deciding which signal of input circuits IBFin of adjacent memory blocks is selected in accordance with a switch control signal from the redundancy decoder 118, and a read selector R-SEL for deciding which signal of the data latches DLT of adjacent memory blocks is selected in accordance with the switch control signal from the redundancy decoder 118.

The pulse generating circuit 115 includes a one-shot pulse generation circuit having a variable delay stage and can adjust a write pulse width by deciding a delay amount in the variable delay stage in accordance with the adjustment signal from the adjustment decoder 117a. Further, the variable delay circuits 116a and 116b serve to make dynamic adjustment corresponding to variation in environment and adjustment for trimming corresponding to scattering in a process, respectively, as described above. Consequently, the delay amount in the variable delay stage can be determined by the adjustment signal from the adjustment decoder 117b to thereby adjust the activation timing for the sense amplifier.

Figure 22:
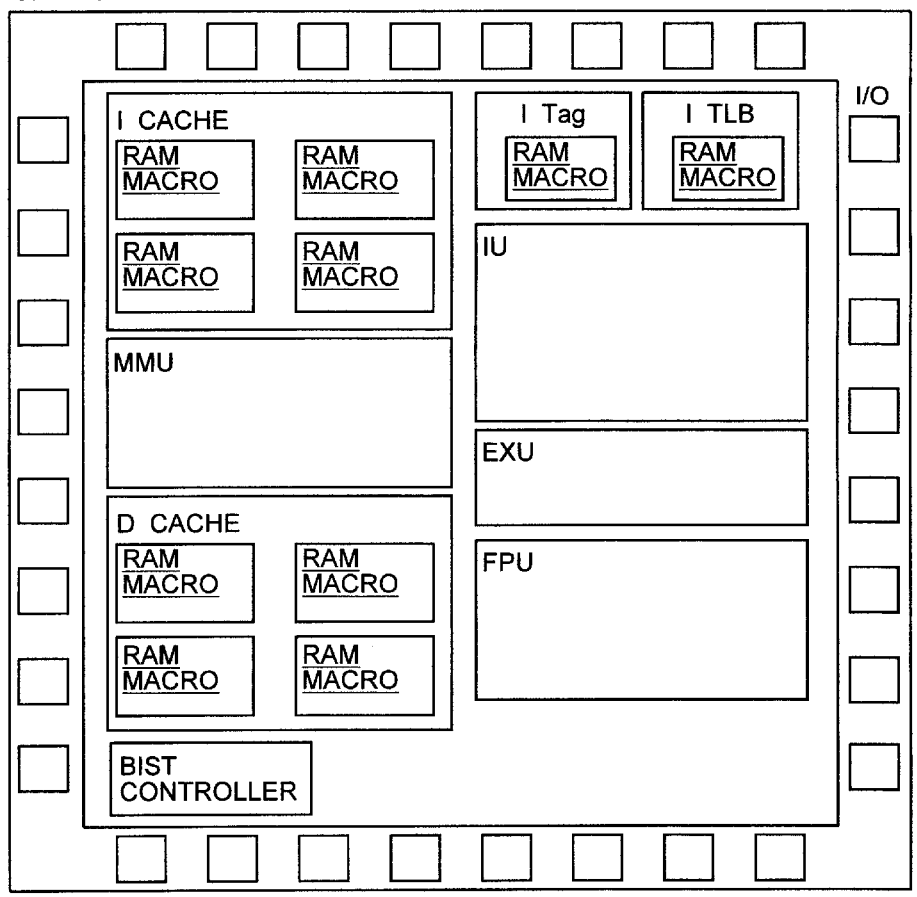
FIG. 22 is a schematic diagram illustrating the whole of an embodiment of a semiconductor integrated circuit device according to the present invention.

FIG. 22 is a schematic diagram illustrating the whole of an embodiment of a semiconductor integrated circuit device according to the present invention. Circuit blocks illustrated in FIG. 22 are shown in accordance with a geometrical arrangement in a practical semiconductor chip.

The embodiment is directed to one-chip microprocessor and includes an instruction cache (I Cache), an instruction translation look-aside buffer (I TLB), an instruction tag (I Tag), a data cache (D Cache), a data translation look-aside buffer (D TLB), a data tag (D Tag), a memory management unit (MMU), an instruction unit (IU), an execution unit (EXU), a floating point unit (FPU), and a testing circuit (BIST CONTROLLER).

The above circuit blocks each includes a plurality of RAM macro-cells provided in a corresponding manner to the respective functions and a memory access time thereof greatly influences an operation speed of the circuit blocks. In the embodiment, since the environment margin and the manufacture margin to the sense amplifier can be set to the minimum as described above, the high-speed operation of the microprocessor can be performed. Further, since the activation timing of the sense amplifier can be verified by the testing circuit without cutting of a fuse in the probing process, simplification of the manufacturing process can be attained.

The effects obtained by the embodiment are as follows:
(1) The timing signal for activating the sense amplifier supplied with the signal read out from the memory array to amplify the signal is delayed by a first variable delay circuit so that a timing difference of the dummy signal read out from the dummy memory cell and the timing signal of the sense amplifier is detected by a detection circuit to reduce the timing difference in accordance with an output of the detection circuit and a relative timing difference of the dummy signal and the timing signal of the sense amplifier can be adjusted by a second variable delay circuit to thereby make it possible to use the sense amplifier at the operation limit thereof in accordance with scattering in a process of the individual circuits and attain reduction of the timing margin and improvement of the access time.
(2) In addition to the above effects, the memory array is constituted by the plurality of normal memory cells disposed at the intersecting points of the plurality of word lines and the plurality of pairs of complementary bit lines and the dummy memory cells disposed in a corresponding manner to the dummy word lines and the pairs of dummy bit lines, so that the signal from the dummy bit lines can be caused to correspond to the signal read out from the normal memory cell and monitoring operation can be made with high accuracy.

(3) In addition to the above effects, the sense amplifier is provided in a corresponding manner to the data lines disposed in a corresponding manner to the plurality of column switches disposed in a corresponding manner to the plurality of pairs of complementary bit lines in the memory array to thereby provide the sense amplifier in a corresponding to the plurality of pairs of bit lines and accordingly simplification of the circuit and increase of the memory capacity can be attained.

(4) In addition to the above effects, the dummy signal is formed by amplifying the signal on one of the pair of dummy bit lines and the detection circuit is constituted by the phase comparator, so that the timing of the activation signal of the sense amplifier can be adjusted by the simple circuit.

(5) In addition to the above effects, the up/down signal corresponding to the timing difference is formed by means of the phase comparator and is counted by the up/down counter circuit to be converted into the digital signal so that the first variable delay circuit controls the delay time by means of the digital signal to thereby make it possible to stabilize the operation and reduce the power consumption since the circuit can be configured by means of digital circuits.

(6) In addition to the above effects, the second variable delay circuit is constituted by a combination of the fixed delay circuit connected to one input of the detection circuit and the variable delay circuit connected to the other input to thereby make it possible to adjust the timing difference with high accuracy and in both the positive and negative directions.

(7) In addition to the above effects, the second variable delay circuit is constituted in accordance with the number of dummy memory cells connected to the pair of dummy bit lines to make it possible to attain simplification of the circuit.

(8) In addition to the above effects, the plurality of pairs of dummy bit lines each having the different number of memory cells connected thereto are provided as the pair of dummy bit lines and any one of the plurality of pairs of dummy bit lines is selected by the selection circuit to thereby simplify setting of the second variable delay circuit.

(9) In addition to the above effects, since the signal formed by the testing circuit and the signal formed by the fuse circuit are selectively supplied as the signal for setting the delay time of the second variable delay circuit to thereby verify the optimum timing in the second variable delay circuit without cutting of a fuse, the manufacturing process can be simplified and the timing of the sense amplifier can be set with high accuracy.

(10) In addition to the above effects, there are provided the plurality of memory circuits each having the identification circuit for judging whether an inputted identification code is identical with its own identification code or not and the latch circuit, and when the identification circuit judges that the inputted identification code is identical with its own identification code, the input information set to the fuse circuit is held in the latch circuit and the input information thus held is caused to contain the signal for setting the delay time of the second variable delay circuit, so that flexibility and simplification of the circuit function can be attained.

(11) The semiconductor integrated circuit device including the memory circuit containing the sense amplifier for amplifying the signal read out from the memory array in accordance with the timing signal is provided with a first circuit for controlling the operation timing signal of the sense amplifier in accordance with variation in environment and a second circuit for controlling the operation timing signal of the sense amplifier in accordance with scattering in characteristics of elements of the memory circuit to thereby make it possible to use the sense amplifier at its operation limit in accordance with scattering in a process of the individual circuits and attain reduction of the timing margin and improvement of the access time.

(12) In addition to the above effects, the first circuit is constituted by the first variable delay circuit which delays the operation timing signal so that the timing difference of the dummy signal read out from the dummy memory cell and the operation timing signal of the sense amplifier is reduced in accordance with a detection output of the detection circuit which detects the timing difference to thereby make it possible to automatically adjust the timing of the sense amplifier in accordance with variation in environment.

(13) In addition to the above effects, the second circuit is constituted by the second variable delay circuit which adjusts the relative timing difference of the dummy signal and the operation timing signal of the sense amplifier to thereby make it possible to use the sense amplifier at its operation limit in accordance with scattering in a process of the individual circuits.

(14) In addition to the above effects, the memory array is constituted by the plurality of normal memory cells disposed at the intersecting points of the plurality of word lines and the plurality of pairs of complementary bit lines and the dummy memory cells disposed in a corresponding manner to the dummy word line and the pair of dummy bit lines to thereby make it possible to cause the signal from the dummy bit lines to correspond to the signal read out from the normal memory cell and attain the monitoring operation with high accuracy.

(15) In addition to the above effects, there are provided the plurality of memory cells each having the identification circuit for judging whether an inputted identification code is identical with its own identification code or not and the latch circuit and when the identification circuit judges that the inputted identification code is identical with its own identification code, the input information set to the fuse circuit is held in the latch circuit and the input information thus held is caused to contain the signal for setting the delay time of the second variable delay circuit, so that flexibility and simplification of the circuit function can be attained.

The inventions made by the Inventor have been described definitely on the basis of the embodiments, while it is needless to say that the present invention is not limited to the embodiments and various modifications and changes may be made without departing from the spirit and the scope of the present invention. For example, the testing circuit may be formed into various circuit configurations. The fuse circuit may be cut electrically. The foregoing description is made to the case where the inventions made by the Inventor are mainly applied to the LSI such as the microprocessor including the plurality of RAMs belonging to the utilization field of the background of the present invention, while the present invention is not limited thereto and can be widely utilized in the semiconductor integrated circuit device including the circuit for setting the optimum timing in accordance with change in environment and variation of scattering in a process by means of the fuse circuit.

The effects obtained by the representatives of the inventions disclosed in the present application are summarized as follows: The timing signal for activating the sense amplifier supplied with the signal read out from the memory array to amplify the signal is delayed by a first variable delay circuit so that a timing difference of the dummy signal read out from the dummy memory cell and the timing signal of the sense amplifier is detected by the detection circuit to reduce the timing difference in accordance with the output of the detection circuit and the relative timing difference of the dummy signal and the timing signal of the sense amplifier can be adjusted by a second variable delay circuit to thereby make it possible to use the sense amplifier at the operation limit thereof in accordance with scattering in a process of the individual circuits and attain reduction of the timing margin and improvement of the access time.

The semiconductor integrated circuit device including the memory circuit containing the sense amplifier for amplifying the signal read out from the memory array in accordance with the timing signal is provided with the first circuit for controlling the operation timing signal of the sense amplifier in accordance with variation in environment and the second circuit for controlling the operation timing signal of the sense amplifier in accordance with scattering in characteristics of elements of the memory circuit to thereby make it possible to use the sense amplifier at the operation limit thereof in accordance with scattering in a process of the individual circuits and attain reduction of the timing margin and improvement of the access time.

It will be further understood by those skilled in the art that the foregoing description has been made on embodiments of the invention and that various changes and modifications may be made in the invention without departing from the spirit of the invention and scope of the appended claims.

What is claimed is:

1. A semiconductor integrated circuit device comprising a memory circuit including:
   a sense amplifier supplied with a signal read out from a memory array and having amplification operation controlled by a timing signal;
   a detection circuit for detecting a timing difference of a dummy signal read out from a dummy memory cell and the timing signal of said sense amplifier;
   a first variable delay circuit for delaying the timing signal so that the timing difference is reduced in accordance with a detection output of said detection circuit; and
   a second variable delay circuit for adjusting a relative timing difference of the dummy signal and the timing signal of said sense amplifier.

2. A semiconductor integrated circuit device according to claim 1, wherein
   said memory array includes a plurality of normal memory cells disposed at intersecting points of a plurality of word lines and a plurality of pairs of complementary bit lines, and dummy memory cells disposed in a corresponding manner to a dummy word line and a pair of dummy bit lines.

3. A semiconductor integrated circuit device according to claim 2, wherein
   said memory array includes a plurality of column switches disposed in a corresponding manner to said plurality of pairs of complementary bit lines and data lines disposed in a corresponding manner to said plurality of column switches, and
   said sense amplifier is disposed in a corresponding manner to said data lines.

4. A semiconductor integrated circuit device according to claim 3, wherein
   said dummy signal is formed by amplifying a signal on one of said pair of dummy bit lines, and
   said detection circuit comprises a phase detector.

5. A semiconductor integrated circuit device according to claim 4, wherein
   said phase comparator produces an up/down signal corresponding to the timing difference, and
   said up/down signal is counted by an up/down counter circuit to be converted into a digital signal,
   said first variable delay circuit having a delay time controlled by said digital signal.

6. A semiconductor integrated circuit device according to claim 1, wherein
   said second variable delay circuit is constituted by a combination of a fixed delay circuit connected to one input of said detection circuit and a variable delay circuit connected to the other input thereof.

7. A semiconductor integrated circuit device according to claim 1, wherein
   said second variable delay circuit is constituted in accordance with the number of dummy memory cells connected to said pair of dummy bit lines.

8. A semiconductor integrated circuit device according to claim 7, wherein
   said pair of dummy bit lines includes a plurality of pairs of dummy bit lines each having the different number of memory cells connected thereto and a selection circuit for selecting any one of said plurality of pairs of dummy bit lines.

9. A semiconductor integrated circuit device according to claim 6, wherein
   said second variable delay circuit is selectively supplied with a signal formed in a testing circuit and a signal formed in a fuse circuit as a signal for setting a delay time of said second variable delay circuit.

10. A semiconductor integrated circuit device according to claim 9, wherein
    there are provided a plurality of said memory circuits, and
    each of said memory circuits further includes an identification circuit for judging whether an inputted identification code is identical with its own identification code or not and a latch circuit,
    input information set in said fuse circuit being held in said latch circuit when said identification circuit judges that the inputted identification code is identical with its own identification code, said input information thus held containing a signal for setting a delay time of said second variable delay circuit.

11. A semiconductor integrated circuit device including a memory circuit containing a sense amplifier for amplifying a signal read out from a memory array in accordance with a timing signal, comprising:
    a first circuit for controlling an operation timing signal of said sense amplifier in accordance with variation in environment; and
    a second circuit for controlling the operation timing signal of said sense amplifier in accordance with scattering in characteristics of elements of said memory circuit, wherein said first circuit includes:
       a detection circuit for detecting a timing difference of a dummy signal read out from a dummy memory cell and the operation timing signal of said sense amplifier; and a first variable delay circuit for delaying the operation timing signal so that said timing difference is reduced in accordance with a detection output of said detection circuit.

12. A semiconductor integrated circuit device according to claim 11, wherein said second circuit includes:

a second variable delay circuit for adjusting a relative timing difference of the dummy signal and the operation timing signal of said sense amplifier.

13. A semiconductor integrated circuit device according to claim 12, wherein said memory array includes a plurality of normal memory cells disposed at intersecting points of a plurality of word lines and a plurality of pairs of complementary bit lines and dummy memory cells disposed in a corresponding manner to a dummy word line and a pair of dummy bit lines.

14. A semiconductor integrated circuit device according to claim 12, wherein there are provided a plurality of said memory circuits, and each of said memory circuits further includes an identification circuit for judging whether an inputted identification code is identical with its own identification code or not and a latch circuit, input information set in a non-volatile memory circuit being held in said latch circuit when said identification circuit judges that the inputted identification code is identical with its own identification code, said input information thus held containing a signal for setting a delay time of said second variable delay circuit.

15. A semiconductor integrated circuit device comprises:

a sense amplifier supplied with a signal read out from a memory array;

a detection circuit for detecting a dummy signal read out from a dummy memory cell;

a first variable delay circuit for adjusting an operation timing signal of said sense amplifier in accordance with a detection output of said detection circuit; and a second variable delay circuit for controlling a delay time when the dummy signal is transmitted to said detection circuit.

* * * * *